United States Patent
Kim et al.

(10) Patent No.: US 11,346,659 B2
(45) Date of Patent: May 31, 2022

(54) DEVICE FOR MEASURING THICKNESS OF SPECIMEN AND METHOD FOR MEASURING THICKNESS OF SPECIMEN

(71) Applicant: INDUSTRY-UNIVERSITY COOPERATION FOUNDATION HANYANG UNIVERSITY, Seoul (KR)

(72) Inventors: Hak Sung Kim, Seoul (KR); Gyung Hwan Oh, Seoul (KR); Dong Woon Park, Seoul (KR)

(73) Assignee: INDUSTRY-UNIVERSITY COOPERATION FOUNDATION HANYANG UNIVERSITY, Seoul (KR)

(*) Notice: Subject to any disclaimer, the term of this patent is extended or adjusted under 35 U.S.C. 154(b) by 0 days.

(21) Appl. No.: 17/188,093

(22) Filed: Mar. 1, 2021

(65) Prior Publication Data

US 2021/0180946 A1 Jun. 17, 2021

Related U.S. Application Data

(63) Continuation of application No. PCT/KR2019/010184, filed on Aug. 12, 2019.

(30) Foreign Application Priority Data

Aug. 27, 2018 (KR) .................. 10-2018-0100703

(51) Int. Cl.
*G01B 15/02* (2006.01)
*G01N 21/3586* (2014.01)
*G01N 21/84* (2006.01)

(52) U.S. Cl.
CPC ......... *G01B 15/02* (2013.01); *G01N 21/3586* (2013.01); *G01N 21/8422* (2013.01)

(58) Field of Classification Search
CPC ............... G01B 15/02; G01B 2210/42; G01B 2210/44; G01B 11/0616; H01L 22/12;
(Continued)

(56) References Cited

U.S. PATENT DOCUMENTS 10,076,261 B2 * 9/2018 Arnone ............. G01N 21/4795
2012/0326037 A1 12/2012 Ohtake et al.
(Continued)

FOREIGN PATENT DOCUMENTS

JP 2014-081285 A 5/2014
KR 10-2018-0040636 A 4/2018

OTHER PUBLICATIONS

Dong-Woon Park el al., "Development of Refractive Index and Thickness Measurement Algorithm Using the Pulse Type Terahertz Time Domain Spectroscopy", The Korean Society of Mechanical Engineers, Nov. 2017, pp. 1963-1966.
Sung Hyeon Park et al., "The Doping Concentration and Physical Properties Measurement of Silicon Wafer Using Terahertz Wave", The Korean Society For Nondestructive Testing, Feb. 2017, pp. 1-6.
Notification of Reason for Refusal for corresponding KR 10-2018-0100703, dated Jun. 18, 2019.
(Continued)

*Primary Examiner* — David P Porta
*Assistant Examiner* — Gisselle M Gutierrez
(74) *Attorney, Agent, or Firm* — Sughrue Mion, PLLC

(57) ABSTRACT

A method for measuring the thickness of a specimen, according to an embodiment, can measure the thickness of a specimen having multiple layers in a contactless and non-destructive manner. In addition, when the refractive indexes of materials forming the respective layers are already known, the thicknesses of the respective layers can be integrally measured through differences in reflection times of terahertz waves with respect to the respective layers of the specimen, thereby measuring the thickness of the specimen, such that the time taken for measuring the thickness of the specimen can be reduced. Furthermore, when the refractive indexes of the materials forming the respective layers are not known, the refractive indexes of the respective
(Continued)

layers can be measured through differences in transmission times and reflection times of terahertz waves with respect to the respective layers of the specimen, and at the same time, the thicknesses of the respective layers can be measured through differences in transmission times or reflection times of terahertz waves with respect to the respective layers of the specimen, so that the thickness of various specimens can be measured. As such, the present invention has a wide range of applications.

16 Claims, 16 Drawing Sheets

(58) Field of Classification Search
CPC .......... G01N 21/3586; G01N 21/8422; G01N 21/3581; G06F 17/10
USPC ........................................ 250/340
See application file for complete search history.

(56) References Cited

U.S. PATENT DOCUMENTS

| | | | | |
|---|---|---|---|---|
| 2014/0061470 | A1* | 3/2014 | Nakayama | H04N 5/30 250/338.4 |
| 2014/0240509 | A1* | 8/2014 | Nakayama | H01S 5/026 348/162 |
| 2015/0076354 | A1* | 3/2015 | Koizumi | G01N 33/48 250/341.8 |
| 2018/0347963 | A1* | 12/2018 | Thiel | G01N 21/3586 |
| 2019/0107485 | A1* | 4/2019 | Thiel | G01B 11/24 |

OTHER PUBLICATIONS

Grant of Patent for corresponding KR 10-2018-0100703, dated Nov. 4, 2019.
Written Opinion for PCT/KR2019/010184, dated Dec. 16, 2019.
International Search Report for PCT/KR2019/010184, dated Dec. 16, 2019.

* cited by examiner

DEVICE FOR MEASURING THICKNESS OF SPECIMEN AND METHOD FOR MEASURING THICKNESS OF SPECIMEN

TECHNICAL FIELD

Embodiments relate to a specimen thickness measuring device.

Embodiments relate to a specimen thickness measuring method.

Embodiments relate to a storage medium in which a specimen thickness measuring program is stored.

BACKGROUND ART

Currently, as a high-tech industry such as a semiconductor industry or a display industry field has been developed, high densification and miniaturization techniques are in the spotlight, and thus it is also necessary to develop a nondestructive inspection technique.

Particularly, in the semiconductor industry field or the display industry field, specimens having a variety of thicknesses and shapes which are used in micro-precise components have been manufactured. The specimens may correspond to thin films. Since the specimens have a great influence on performance of a product, it is necessary to manufacture the specimen to have an even thickness. Accordingly, it is necessary to measure a precise thickness of the specimen in a process of manufacturing the specimen.

Also, a terahertz wave has features such as an excellent transmittance with respect to a nonconductive material except metals and lower energy than an X-ray so as not to be harmful to a human body. According to the features of the terahertz wave, the terahertz wave is applicable to nondestructive inspection techniques.

Also, in the process of manufacturing the specimen, the specimen may include multiple thin films. It is difficult to separately measure a thickness of each of respective layers with respect to the specimen including multiple thin films during the manufacturing process. Accordingly, when the specimen includes multiple thin films, it is necessary to integrally measure a thickness of each thin film included in the specimen while the specimen is not separated into respective thin films.

DISCLOSURE

Technical Problem

Embodiments provide a method of measuring a thickness of a specimen using a terahertz wave.

Embodiments provide a method of measuring a thickness of a multilayered specimen using a terahertz wave.

Embodiments provide a method of measuring a thickness of each layer of a multilayered specimen.

Embodiments provide a method of measuring a thickness of each layer of a multilayered specimen using a reflection time of a terahertz wave emitted toward each layer of the specimen.

Embodiments provide a method of measuring a thickness of each layer of a multilayered specimen by measuring a refractive index of each layer of the specimen and measuring the thickness of each layer of the specimen on the basis of the measured refractive index of each layer.

Embodiments provide a method of measuring a thickness of each layer of a multilayered specimen by measuring a refractive index of each layer using a transmission time and a reflection time of a terahertz wave emitted toward each layer of the specimen and measuring a thickness of each layer of the specimen using the reflection time or transmission time of the terahertz wave emitted toward each layer of the specimen on the basis of the measured refractive index of each layer.

Aspects of the present invention are not limited to the above-described aspect and other unstated aspects should be clearly understood by one of ordinary skill in the art from the specification and the attached drawings.

Technical Solution

According to an aspect of a specimen thickness measuring method, the specimen thickness measuring method includes emitting a first terahertz wave toward a specimen including a first layer and a second layer, receiving a first reflected terahertz wave, emitting a second terahertz wave, receiving a second reflected terahertz wave, storing refractive indexes of the first layer and the second layer, and calculating thicknesses of the first layer and the second layer. The emitting of the first terahertz wave may include emitting the first terahertz wave toward a first area of an upper portion of the first layer in the specimen including the first layer and the second layer, a lower portion of the second layer of the specimen may come into contact with at least a part of the upper portion of the first layer, and the upper portion of the first layer may include the first area formed by removing at least a part of the second layer. The receiving of the first reflected terahertz wave may include receiving the first reflected terahertz wave reflected by the specimen. The emitting of the second terahertz wave may include emitting the second terahertz wave toward a second area of an upper portion of the second layer. The receiving of the second reflected terahertz wave may include receiving the second reflected terahertz wave reflected by the specimen. The storing of the refractive indexes of the first layer and the second layer may include storing the refractive indexes of the first layer and the second layer. The calculating of the thicknesses of the first layer and the second layer may include calculating the thicknesses of the first layer and the second layer on the basis of at least one of a first reflection time in which the first reflected terahertz wave is reflected and received, a second reflection time in which the second reflection terahertz wave is reflected and received, and the refractive index of each layer. The first area and the second area may be mutually different areas.

According to an aspect of a specimen thickness measuring device, the specimen thickness measuring device includes an emission unit, a reception unit, and a control unit. The emission unit may emit a terahertz wave including a terahertz wave and a second terahertz wave toward a specimen including a first layer and a second layer. The reception unit may receive a reflected terahertz wave including a first reflected terahertz wave and a second reflected terahertz wave which are reflected by the specimen. The control unit may control the emission unit and the reception unit. The control unit may be configured to control the emission unit to emit a first terahertz wave toward a first area of an upper portion of the first layer in the specimen, in which a lower portion of the second layer of the specimen comes into contact with at least a part of the upper portion of the first layer and the upper portion of the first layer includes a first area formed by removing at least a part of the second layer, to control the reception unit to receive a first reflected terahertz wave reflected by the specimen, to control the emission unit to emit a second terahertz wave toward the second area of an upper portion of the second layer, to control a second reflected terahertz wave reflected by the specimen to be received, to control refractive indexes of the first layer and the second layer to be stored, and to control thicknesses of the first layer and the second layer to be calculated on the basis of at least one of a first reflection time when the first reflected terahertz wave is reflected and received, a second reflection time when the second reflected terahertz wave is reflected and received, and a refractive index of each layer. The first area and the second area may be mutually different areas.

According to an aspect of a storage medium in which a specimen thickness measuring program is stored, the storage medium in which a specimen thickness measuring program is stored may measure a thickness of a specimen according to a specimen thickness measuring method including emitting a first terahertz wave toward a specimen including a first layer and a second layer, receiving a first reflected terahertz wave, emitting a second terahertz wave, receiving a second reflected terahertz wave, storing refractive indexes of the first layer and the second layer, and calculating thicknesses of the first layer and the second layer. The emitting of the first terahertz wave may include emitting the first terahertz wave toward a first area of an upper portion of the first layer in the specimen including the first layer and the second layer, a lower portion of the second layer of the specimen may come into contact with at least a part of the upper portion of the first layer, and the upper portion of the first layer may include the first area formed by removing at least a part of the second layer. The receiving of the first reflected terahertz wave may include receiving the first reflected terahertz wave reflected by the specimen. The emitting of the second terahertz wave may include emitting the second terahertz wave toward a second area of an upper portion of the second layer. The receiving of the second reflected terahertz wave may include receiving the second reflected terahertz wave reflected by the specimen. The storing of the refractive indexes of the first layer and the second layer may include storing the refractive indexes of the first layer and the second layer. The calculating of the thicknesses of the first layer and the second layer may include calculating the thicknesses of the first layer and the second layer on the basis of at least one of a first reflection time in which the first reflected terahertz wave is reflected and received, a second reflection time in which the second reflection terahertz wave is reflected and received, and the refractive index of each layer. The first area and the second area may be mutually different areas.

Advantageous Effects

According to embodiments, in a specimen thickness measuring method, since it is possible to measure a thickness of each layer of a multilayered specimen by emitting a terahertz wave toward each layer of the specimen, an effect of performing a nondestructive inspection on each layer of the specimen may be provided. The terahertz wave may have transmittance higher than a visible ray or an infrared ray so as to be available even in a place with external light and may provide an effect of measuring a thickness of a specimen without an additional process of blocking the external light.

In the specimen thickness measuring method according to embodiments, since it is possible to measure the thickness of each layer of the multilayered specimen by emitting the terahertz wave toward each layer in consideration of a difference between a reflection time of a surface-reflected terahertz wave reflected by a surface of each layer of the specimen and a reception time of a backside-reflected terahertz wave reflected by a backside of the specimen in addition to a pre-obtained refractive index of each layer of the multilayered specimen, an effect of integrally measuring the thickness of each layer of the specimen may be provided.

In the specimen thickness measuring method according to embodiments, a refractive index of each layer of the multilayered specimen may be measured by emitting the terahertz wave toward each layer of the multilayered specimen in consideration of a reflection time difference of the terahertz waves transmitted through respective layers of the specimen and a reflection time difference of the terahertz waves of the respective layers of the specimen and the thickness of each layer of the specimen may be measured using the reflection time difference of the respective layers of the specimen or a transmission time difference of the respective layers of the specimen on the basis of the measured refractive index of each layer of the specimen, thus, an effect of measuring the refractive index and the thickness of each layer of the specimen at the same time may be provided.

Accordingly, the specimen thickness measuring method according to embodiments may measure the thickness of the multilayered specimen in a non-contact and nondestructive manner. Also, when a refractive index of a material included in each layer is already known, since the thicknesses of the respective layers may be integrally measured using a difference in terahertz wave reflection times of the respective layers of the specimen, a time of measuring the thickness of the specimen may be reduced. Also, when the refractive index of the material included in each layer is not known, the refractive index of each layer may be measured using a difference in terahertz wave transmission times and a difference in reflection times of the respective layers of the specimen, simultaneously, the thickness of each layer may be measured using the difference in terahertz wave transmission times or the difference in terahertz wave reflection times of the respective layers of the specimen so as to measure thicknesses of a variety of specimens, thus, an effect having high availability may be provided.

Also, in the specimen thickness measuring method according to embodiments, when a point toward which a terahertz wave is emitted to measure a refractive index of each layer of the specimen is equal to a point toward which a terahertz wave is emitted to measure a thickness of each layer of the specimen, an effect of increasing precision in measuring the thickness of each layer of the specimen may be provided.

Effects of the present invention are not limited to the above-described effect and other unstated effects should be clearly understood by one of ordinary skill in the art from the specification and the attached drawings.

MODES OF THE INVENTION

Figure 1:
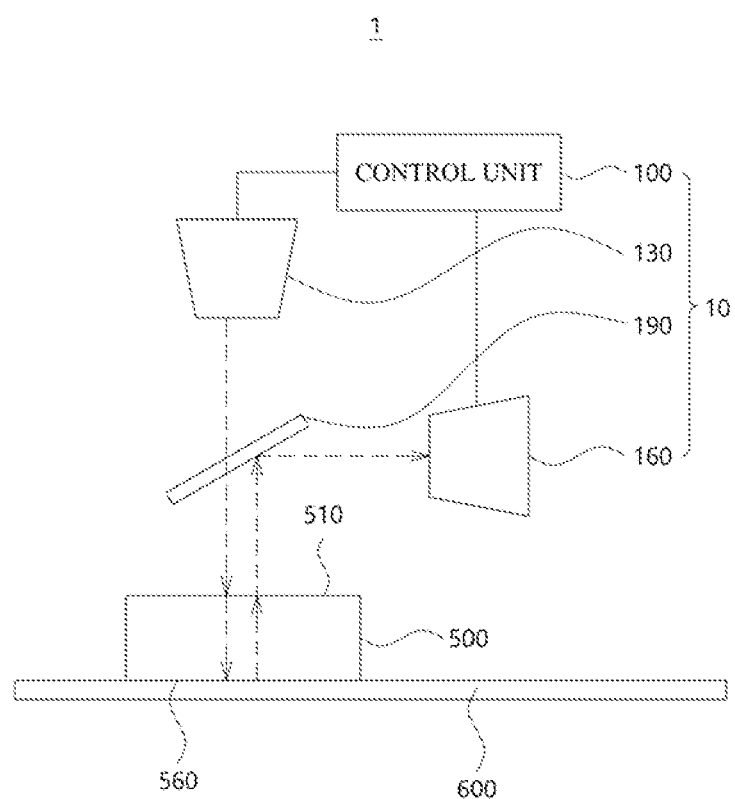
FIG. 1 is a view illustrating a specimen thickness measuring system according to one embodiment.

Hereinafter, specific embodiments of the present invention will be described in detail with reference to the drawings. However, the concept of the present invention is not limited to the disclosed embodiments, and one of ordinary skill in the art may easily implement retrogressive invention or other embodiments included in the conceptual scope of the present invention through addition, change, deletion, and the like of another component without departing from the conceptual scope, which should be included in the conceptual scope of the present invention.

Also, in the drawings with respect to the embodiments, elements having the same function within the same conceptual scope will be referred to with the same reference numerals.

According to one embodiment of the present application, there may be provided a specimen thickness measuring method, the method including emitting, a first terahertz wave toward a first area of an upper portion of a first layer of a specimen including the first layer and a second layer, wherein a lower portion of the second layer of the specimen contacts at least part of the upper portion of the first layer, and the upper portion of the first layer includes a first area formed by removing at least part of the second layer; receiving a first reflected terahertz wave reflected by the specimen; emitting a second terahertz wave toward a second area of an upper portion of the second layer; receiving a second reflected terahertz wave reflected by the specimen; storing refractive indexes of the first layer and the second layer; and calculating thicknesses of the first layer and the second layer based on at least one of a first reflection time of the first reflected terahertz wave which is reflected and received, a second reflection time of the second reflected terahertz wave which is reflected and received, and a refractive index of each layer, wherein the first area and the second area are different areas.

Also, there may be provided the specimen thickness measuring method, in the method, the thicknesses of the first layer and the second layer are calculated based on the first reflection time and the second reflection time, wherein the first reflection time is a difference between a time when a first surface-reflected terahertz wave is received and a time when a first backside-reflected terahertz wave is received, wherein the first reflection time is a difference between a time when a second surface-reflected terahertz wave is received and a time when a second backside-reflected terahertz wave is received, wherein the first reflected terahertz wave includes the first surface-reflected terahertz wave and the first backside-reflected terahertz wave, wherein the second reflected terahertz wave includes the second surface-reflected terahertz wave and the second backside-reflected terahertz wave, wherein the first surface-reflected terahertz wave is that the first terahertz wave is reflected from a surface of the first area, and the first backside-reflected terahertz wave is that the first terahertz wave is reflected from a backside of the specimen, wherein the second surface-reflected terahertz wave is that the second terahertz wave is reflected from a surface of the second area, and the second backside-reflected terahertz wave is that the second terahertz wave is reflected from the backside of the specimen.

Also, there may be provided the specimen thickness measuring method, in the method, the calculating of thicknesses of the first layer and the second layer on the basis of the first reflection time, the second reflection time, and the refractive index of the first layer and the refractive index of the second layer may employ an equation, $$d_{layer/k} = \frac{C \cdot (t_{re_k} - t_{re_{k-1}})}{2 \cdot n_{layer/k}}$$

(C: speed of light, $d_{layer/k}$: thickness of k layer, $n_{layer/k}$: refractive index of k layer, $t_{re_k}$: reflection time of k layer, $t_{re_{k-1}}$: reflection time of k−1 layer).

Also, there may be provided the specimen thickness measuring method, in the method, the refractive indexes of the first layer and the second layer are respectively pre-stored refractive indexes, wherein when measuring the thicknesses of the first layer and the second layer, values of the refractive indexes are respectively employed.

Also, there may be provided the specimen thickness measuring method, in the method, the thicknesses of the first layer and the second layer are available for being measured multiple times for at least one of a first area and a second area, wherein average values of each of values of the thicknesses of the first layer and the second layer obtained by measuring multiple times are the thicknesses of the first layer and the second layer.

Also, there may be provided the specimen thickness measuring method, in the method, the refractive indexes of the first layer and the second layer are calculated based on at least one of a third reflected terahertz wave, a fourth reflected terahertz wave, a first transmitted terahertz wave, and a second transmitted terahertz wave, wherein the third reflected terahertz wave is formed by reflecting the first terahertz wave to a third area, wherein the fourth reflected terahertz wave is formed by reflecting the second terahertz wave to a fourth area, wherein the first transmitted terahertz wave is formed by transmitting the first terahertz wave through a third area, wherein the second transmitted terahertz wave is formed by transmitting the second terahertz wave through a fourth area, wherein the third area is located at the upper portion of the first layer, the fourth area is located at the upper portion of the second layer, and the first layer includes a third area formed by removing at least a part of the second layer, wherein the third area and the fourth area are different areas.

Also, there may be provided the specimen thickness measuring method, in the method, the refractive index of the first layer and the refractive index of the second layer are calculated based on a third reflection time, a fourth reflection time, a first transmission time and a second transmission time, wherein the third reflection time is a difference between a time when a third surface-reflected terahertz wave is received and a time when a third backside-reflected terahertz wave is received, wherein the fourth reflection time is a difference between a time when a fourth surface-reflected terahertz wave is received and a time when a fourth backside-reflected terahertz wave is received, wherein the first transmission time is a difference between a time when the first transmitted terahertz wave is received and a time when the third transmitted terahertz wave is received, wherein the second transmission time is difference between a time when the second transmitted terahertz wave is received and a time when the third transmitted terahertz wave is received, wherein the third reflected terahertz wave includes the third surface-reflected terahertz wave and the third backside-reflected terahertz wave, wherein the fourth reflected terahertz wave includes the fourth surface-reflected terahertz wave and the fourth backside-reflected terahertz wave, wherein the third surface-reflected terahertz wave is that the third terahertz wave is reflected from a surface of the third area, and the third backside-reflected terahertz wave is that the third terahertz wave is reflected from the backside of the specimen, wherein the fourth surface-reflected terahertz wave is that the fourth terahertz wave is reflected from the surface of the second area, and the fourth backside-reflected terahertz wave is that the second terahertz wave is reflected from the backside of the specimen.

Also, there may be provided the specimen thickness measuring method, in the method, the calculating the refractive indexes of the first layer and the second layer based on the third reflection time, the fourth reflection time, the first transmission time, and the second transmission time respectively employs an equation, $$n_{layer/k} = \frac{1}{1 - 2\frac{(t_{tr_k} - t_{tr_{k-1}})}{(t_{re_k} - t_{re_{k-1}})}}.$$

($n_{layer/k}$: refractive index of k layer, $t_{re_k}$: reflection time of k layer, $t_{re_{k-1}}$: reflection time of k-1 layer, $t_{tr_k}$: transmission time of k layer, $t_{tr_{k-1}}$: transmission time of k-1 layer)

Also, there may be provided the specimen thickness measuring method, in the method, the refractive index of the first layer and the refractive index of the second layer are available for being measured multiple times for at least one of the third area and the fourth area, wherein average values of each of values of the refractive indexes of the first layer and the second layer obtained by measuring are the refractive indexes of the first layer and the second layer.

Also, there may be provided the specimen thickness measuring method, in the method, the first area and the third area are same, the second area and the fourth area are same, wherein the refractive indexes of the first layer and the second layer and the thicknesses of the first layer and the second layer are respectively measured at same area.

Also, there may be provided the specimen thickness measuring method, in the method, wherein the first area and the third area are same, the second area and the fourth area are same, and the calculating thicknesses of the first layer and the second layer employs an equation, $$d_{layer/k} = \frac{C \cdot [(t_{re_k} - t_{re_{k-1}}) - 2(t_{tr_k} - t_{tr_{k-1}})]}{2}.$$

(C: speed of light, $d_{layer/k}$: thickness of k layer, $t_{re_k}$: reflection time of k layer, $t_{re_{k-1}}$: reflection time of k-1 layer, $t_{tr_k}$: transmission time of k layer, $t_{tr_{k-1}}$: transmission time of k-1 layer)

Also, there may be provided the specimen thickness measuring method, in the method, the first area and the third area are different, the second area and the fourth area are different, wherein an equation for calculating the refractive index is $$n'_{layer/k} \frac{1}{1 - 2\frac{(t'_{tr_k} - t'_{tr_{k-1}})}{(t'_{re_k} - t'_{re_{k-1}})}},$$

wherein the calculating the thicknesses of the first layer and the second layer employs an equation, $$d_{layer/k} = \frac{C \cdot (t_{re_k} - t_{re_{k-1}})}{2 \cdot n'_{layer/k}} = C \cdot \left\{ (t_{re_k} - t_{re_{k-1}}) \cdot \left[ 1 - 2 \cdot \frac{(t'_{tr_k} - t'_{tr_{k-1}})}{(t'_{re_k} - t'_{re_{k-1}})} \right] \right\} / 2.$$

(C: speed of light, $d_{layer/k}$: thickness of k layer, $n'_{layer/k}$: refractive index of k layer, $t_{re_k}$: reflection time of k layer, $t_{re_{k-1}}$: reflection time of k-1 layer, $t'_{re_k}$: reflection time of k layer in an area different from thickness measurement area, $t'_{re_{k-1}}$: reflection time of the k-1 layer in an area different from thickness measurement area, $t'_{tr_k}$: transmission time of the k layer in an area different from thickness measurement area, $t'_{tr_{k-1}}$: transmission time of the k-1 layer in an area different from thickness measurement area)

Also, there may be provided the specimen thickness measuring method, in the method, the thicknesses and the refractive indexes of the first layer and the second layer are available for being measured multiple times for at least one of a first area and a second area, a third area, and a fourth area, wherein average values of values of the thicknesses or the refractive indexes of the first layer and the second layer obtained by measuring multiple times are the thicknesses of the first layer and the second layer.

According to one embodiment of the present application, there may be provided a specimen thickness measuring device, the device including an emission unit configured to emit a terahertz wave including a first terahertz wave and a second terahertz wave toward a specimen including a first layer and a second layer; a reception unit configured to receive a reflected terahertz wave including a first reflected terahertz wave and a second reflected terahertz wave reflected by the specimen; and a control unit configured to control the emission unit and the reception unit, wherein the control unit is configured to: control the emission unit to emit a first terahertz wave toward a first area of an upper portion of the first layer in the specimen, wherein a lower portion of the second layer of the specimen contacts at least a part of the upper portion of the first layer and the upper portion of the first layer includes a first area formed by removing at least a part of the second layer, control the reception unit to receive a first reflected terahertz wave reflected by the specimen, control the emission unit to emit a second terahertz wave to the second area of an upper portion of the second layer, control to receive a second reflected terahertz wave reflected by the specimen, control to store refractive indexes of the first layer and the second layer, and control to calculate thicknesses of the first layer and the second layer based on at least one of a first reflection time when the first reflected terahertz wave is reflected and received, a second reflection time when the second reflected terahertz wave is reflected and received, and a refractive index of each layer, and wherein the first area and the second area are different areas.

According to one embodiment of the present invention, there may be provided a storage medium which stores a specimen thickness measuring program for measuring thicknesses of a first layer and a second layer of a specimen according to a specimen thickness measuring method including emitting, in a specimen including the first layer and the second layer, a first terahertz wave toward a first area of an upper portion of the first layer, wherein a lower portion of the second layer of the specimen contacts at least part of the upper portion of the first layer, and the upper portion of the first layer includes a first area formed by removing at least part of the second layer; receiving a first reflected terahertz wave reflected by the specimen; emitting a second terahertz wave toward a second area of an upper portion of the second layer; receiving a second reflected terahertz wave reflected by the specimen; storing refractive indexes of the first layer and the second layer; and calculating thicknesses of the first layer and the second layer based on at least one of a first reflection time when the first reflected terahertz wave is reflected and received, a second reflection time when the second reflected terahertz wave is reflected and received, and a refractive index of each layer, wherein the first area and the second area are different areas.

\*Hereinafter, a specimen thickness measuring device and a specimen thickness measuring method according to one embodiment of the present application will be described.

A specimen thickness measuring system according to one embodiment of the present application will be described. FIG. 1 is a view illustrating the specimen thickness measuring system according to one embodiment.

Referring to FIG. 1, the specimen thickness measuring system 1 may include a specimen thickness measuring device 10, a specimen 500, and a tray 600.

The specimen thickness measuring system 1 may measure a thickness of the specimen 500 disposed on the tray 600. The specimen thickness measuring system 1 may measure a thickness of each layer of the multilayered specimen 500 disposed on the tray 600. The specimen thickness measuring device 10 may measure a thickness of the specimen 500 disposed on the tray 600. The specimen thickness measuring device 10 may measure a thickness of the specimen 500 disposed on the tray 600 that is being moved. The specimen thickness measuring device 10 may measure a thickness of each layer of the multilayered specimen 500 disposed on the tray 600.

Referring to FIG. 1, the specimen thickness measuring device 10 may include a control unit 100, an emission unit 130, a reception unit 160, and a beam splitter 190.

The control unit 100 may control the emission unit 130 and the reception unit 160. The control unit 100 may also control the beam splitter 190. The emission unit 130 may face the tray 600. The emission unit 130 may be located above the tray 600. The emission unit 130 may be located while being spaced vertically apart from the tray 600. The beam splitter 190 may be located between the emission unit 130 and the tray 600. The beam splitter 190 may be located on a path of a terahertz wave emitted from the emission unit 130 toward the tray 600. The reception unit 160 may be located while being spaced apart from the beam splitter 190. The reception unit 160 may be located on a path through which the terahertz wave reflected by the tray 600 is reflected by the beam splitter. The tray 600 may be located on a transfer unit. The specimen 500 disposed on the tray 600 may be moved, by the transfer unit, to a position corresponding to the emission unit 130. The control unit 100 may control the transfer unit. Also, the transfer unit may be controlled by an additional control unit.

Hereinafter, each component will be described.

Referring to FIG. 1, the emission unit 130, the reception unit 160, and the beam splitter 190 will be described.

The emission unit 130 may emit a terahertz wave. A wavelength of the terahertz wave emitted by the emission unit 130 may be from 3 mm to 30 um. The terahertz wave may be a continuous type or pulse type. A light source of the terahertz wave may be singular or plural. A frequency of the terahertz wave may be 0.1 THz to 10 THz. The emission unit 130 may emit a terahertz wave within a range of the frequency so as to have transmittance stronger than a visible ray or an infrared ray. Also, since the terahertz wave emitted by the emission unit 130 is available even in a place with external light, a thickness of the specimen 500 may be measured without an additional process of blocking external light.

The beam splitter 190 may reflect or transmit part of incident light. The beam splitter 190 may transmit part of light emitted by the emission unit 130. The transmitted light may be reflected by the specimen 500 on the tray 600. Part of the reflected light may be reflected by the beam splitter 190 and be received by the reception unit 160. The beam splitter 190 may allow the emission unit 130 and the reception unit 160 to be located on the specimen 500.

The reception unit 160 may receive a reflected terahertz wave that is the terahertz wave emitted by the emission unit 130 and reflected by the specimen 500 on the tray 600. The reception unit 160 may receive a surface-reflected terahertz wave reflected by a surface 510 of the specimen 500 or a backside-reflected terahertz wave reflected by a backside 560 of the specimen 500. The reception unit 160 may receive the surface-reflected terahertz wave reflected by the surface 510 of the specimen 500 and the backside-reflected terahertz wave reflected by the backside 560 of the specimen 500.

The light emitted by the emission unit 130 may be emitted toward the beam splitter 190. At least a part of the light emitted by the emission unit 130 may be transmitted through the beam splitter 190. The light transmitted through the beam splitter 190 from the emission unit 130 may be emitted toward the tray 600. At least a part of the light emitted toward the tray 600 may be reflected by the tray 600. At least a part of the light emitted toward the tray 600 may be reflected by the surface 510 of the specimen 500 disposed on the tray 600. At least the part of the light emitted toward the tray 600 may be reflected by the surface 510 of the specimen 500 disposed on the tray 600. At least a part of the light emitted toward the tray 600 may be transmitted through the specimen 500. At least the part of the light transmitted through the tray 600 may be reflected by the backside 560 of the specimen 500 disposed on the tray 600. At least a part of the light reflected by the backside 560 of the specimen 500 may be transmitted through the specimen 500. The light transmitted through the specimen 500 may be emitted toward the beam splitter 190. At least a part of the light reflected by the tray 600 may be reflected by the beam splitter 190. The light reflected by the beam splitter 190 may be received by the reception unit 160.

The specimen 500 and the tray 600 will be described with reference to FIGS. 1 and 2.

The specimen 500 may include a single layer or multiple layers. In the multilayered specimen 500, at least a part of an upper portion and a lower portion of each layer may come into contact with each other. The multilayered specimen 500 may include an area formed by removing at least a part of a lower portion of a layer located relatively higher among at least two adjacent layers and corresponding to an upper portion of a layer located relatively lower. The specimen 500 may be singular or plural.

One or a plurality of specimens 500 may be located on the tray 600. The specimen 500 disposed on the tray 600 may include a single layer or multiple layers. The tray 600 may be transferred, by an additional transfer unit, to a position corresponding to the emission unit 130. The tray 600 may be transferred at a certain speed, by the transfer unit, to the position corresponding to the emission unit 130. The tray 600 may include a material capable of reflecting the terahertz wave emitted by the emission unit 130. When at least some terahertz waves emitted by the emission unit 130 are transmitted through the specimen 500 and reach the tray 600, the tray 600 may reflect at least some terahertz waves transmitted through the specimen.

Figure 2:
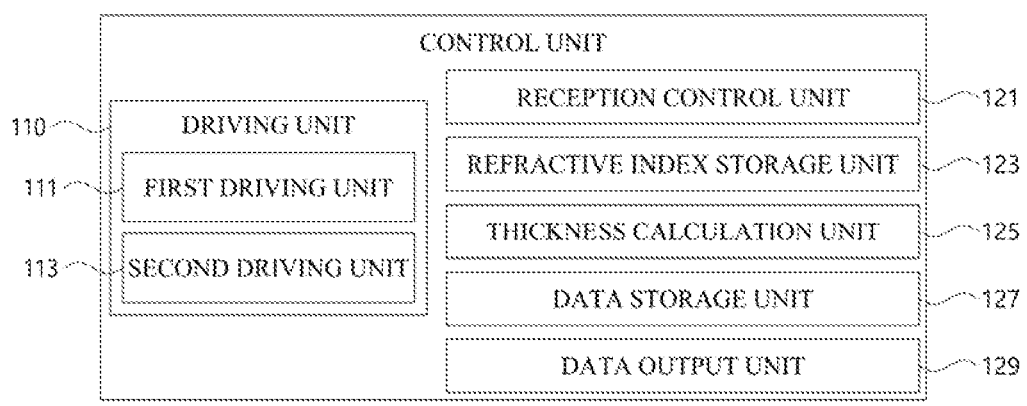
FIG. 2 is a block diagram illustrating a control unit configured to control a specimen thickness measuring device according to one embodiment.

FIG. 2 is a block diagram illustrating the control unit configured to control a specimen thickness measuring device according to one embodiment. Referring to FIG. 2, the control unit 100 may include a driving unit 110, a reception control unit 121, a refractive index storage unit 123, a thickness calculation unit 125, a data storage unit 127, and a data output unit 129.

The control unit 100 will be described with reference to FIGS. 1 and 2.

The driving unit 110 may drive the specimen thickness measuring system 1. The driving unit 110 may drive the specimen thickness measuring device 10 or drive the tray 600 to move. The driving unit 110 may include a first driving unit 111 and a second driving unit 113. The first driving unit 111 may control the emission unit 130 to emit a terahertz wave. The first driving unit 111 may control a terahertz wave to be emitted when the specimen 500 is located at the position corresponding to the emission unit 130. The first driving unit 111 may control a terahertz wave to be emitted when a thickness measuring area of the specimen 500 is located at the position corresponding to the emission unit 130. The second driving unit 113 may transfer the tray 600. The second driving unit 113 may control the specimen 500 disposed on the tray 600 to be transferred to the position corresponding to the emission unit 130.

The reception control unit 121 may control the reception unit 160 to receive the terahertz wave emitted by the emission unit 130. The reception control unit 121 may control the reception unit 160 to receive a reflected terahertz wave that is the terahertz wave emitted by the emission unit 130 and reflected by the specimen 500. The reception control unit 121 may control the reception unit 160 to receive a surface-reflected terahertz wave that is the terahertz wave emitted by the emission unit 130 and reflected by the surface 510 of the specimen 500. The reception control unit 121 may control the reception unit 160 to receive a backside-reflected terahertz wave that is the terahertz wave emitted by the emission unit 130 and reflected by the backside 560 of the specimen 500. The reception control unit 121 may detect a reflection time of the terahertz wave on the basis of the terahertz wave received by the reception unit 160. The reception control unit 121 may detect a reflection time of the terahertz wave reflected by the specimen 500 on the basis of the terahertz wave received by the reception unit 160. The reception control unit 121 may detect a reception time of the surface-reflected terahertz wave and a reception time of the backside-reflected terahertz wave of the reception unit 160 on the basis of the terahertz wave received by the reception unit 160. The reception control unit 121 may detect a difference between the reception time of the surface-reflected terahertz wave and the reception time of the backside-reflected terahertz wave of the reception unit 160 on the basis of the terahertz wave received by the reception unit 160.

The refractive index storage unit 123 may store a refractive index of the specimen 500. The refractive index storage unit 123 may store a predetermined refractive index of the specimen 500. The refractive index storage unit 123 may store an obtained refractive index with respect to the specimen 500. The refractive index storage unit 123 may store at least one of refractive indexes of the respective layers included in the multilayered specimen 500. The refractive index storage unit 123 may store a predetermined refractive index with respect to at least one of the respective layers included in the specimen 500. The refractive index storage unit 123 may store an obtained refractive index with respect to at least one of the respective layers included in the specimen 500.

The thickness calculation unit 125 may calculate a thickness of the specimen 500. The thickness calculation unit 125 may calculate a thickness of the specimen 500 on the basis of a predetermined equation. The thickness calculation unit 125 may calculate the thickness of the specimen 500 on the basis of at least one of the terahertz wave obtained by the reception control unit 121 and the refractive index stored in the refractive index storage unit 123. The thickness calculation unit 125 may calculate the thickness of the specimen 500 on the basis of at least one of a reflection time of the terahertz wave obtained by the reception control unit 121 and the refractive index stored in the refractive index storage unit 123. The thickness calculation unit 125 may calculate at least one of thicknesses of the respective layers included in the specimen 500. The thickness calculation unit 125 may calculate each of thicknesses of adjacent layers among the respective layers included in the specimen 500. The thickness calculation unit 125 may calculate each of thicknesses of two adjacent layers among the respective layers included in the specimen 500.

The data storage unit 127 may store data on a reception time of the surface terahertz wave and a reception time of the backside terahertz wave. The data storage unit 127 may store data on the thickness of the specimen 500 calculated on the basis of at least one of the reception time of the surface terahertz wave, the reception time of the backside terahertz wave, and the refractive index of the specimen 500. The data storage unit 127 may store data on a thickness of each layer of the multilayered specimen 500 which is calculated by the thickness calculation unit 125.

The data output unit 129 may output the data on the thickness of the specimen 500 which is calculated by the thickness calculation unit 125. The data output unit 129 may output the data on the thickness of each layer of the multilayered specimen 500 which is calculated by the thickness calculation unit 125.

Figure 3:
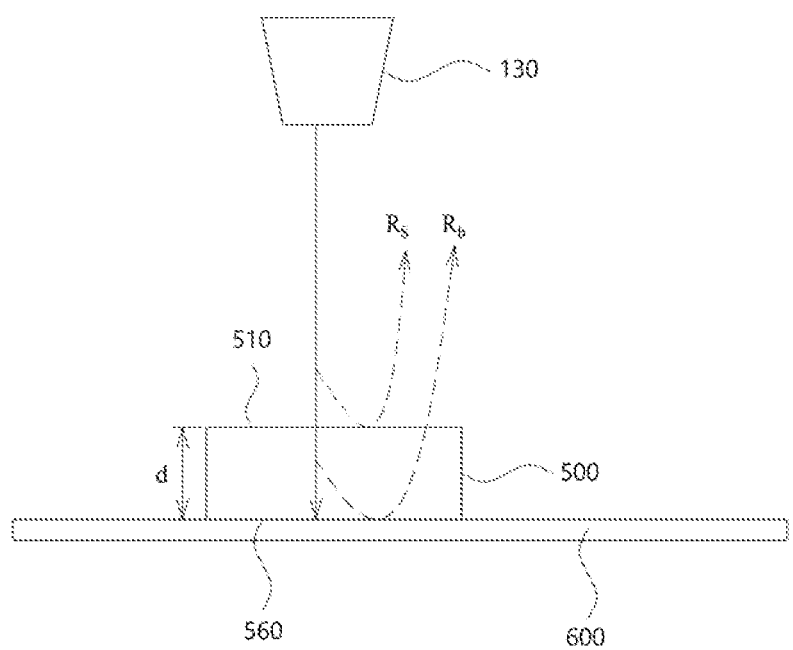
FIGS. 3 and 4 are views illustrating a method of measuring a thickness of a single-layered specimen using the specimen thickness measuring device according to one embodiment.
Figure 4:
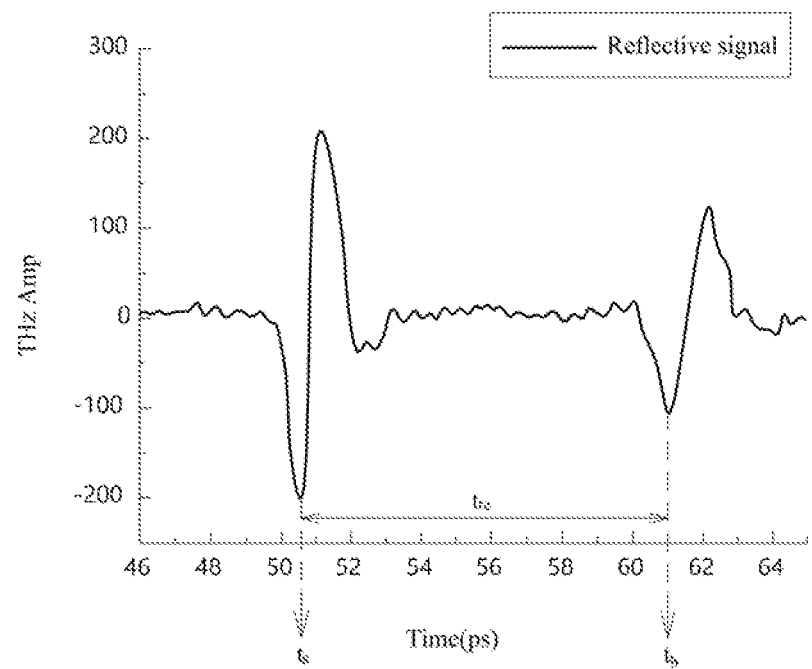

FIGS. 3 and 4 are views illustrating a single-layered specimen in the specimen thickness measuring device according to one embodiment. FIG. 3 is a view illustrating the surface-reflected terahertz wave reflected by the surface of the specimen and the backside-reflected terahertz wave reflected by the backside of the specimen, and FIG. 4 is a view illustrating a difference between the reception times of the surface-reflected terahertz wave and the backside-reflected terahertz wave.

A method of measuring, by the specimen thickness measuring device 10, a thickness d of the specimen 500 will be described with reference to FIGS. 1 to 4.

Referring to FIGS. 3 and 4, the control unit 100 may measure the thickness d of the specimen 500 on the basis of a terahertz wave emitted by the emission unit 130. The control unit 100 may measure the thickness d of the specimen 500 on the basis of a surface-reflected terahertz wave Rs and a backside-reflected terahertz wave Rb. The control unit 100 may measure the thickness d of the specimen 500 on the basis of a reflection time of the terahertz wave emitted by the emission unit 130. The control unit 100 may measure the thickness d of the specimen 500 on the basis of a difference between a reception time of the surface-reflected terahertz wave Rs and a reception time of the backside-reflected terahertz wave Rb.

The surface-reflected terahertz wave Rs may be formed by at least some terahertz waves emitted by the emission unit 130 being reflected by the surface 510 of the specimen 500. The reception unit 160 may receive the surface-reflected terahertz wave Rs reflected by the surface 510 of the specimen 500. The backside-reflected terahertz wave Rb may be formed by at least some terahertz waves emitted by the emission unit 130 being transmitted and reflected by the backside 560 of the specimen 500. The reception unit 160 may receive the backside-reflected terahertz wave Rb reflected by the backside 560 of the specimen 500.

The reception control unit 121 may detect a reflection time in which the terahertz wave emitted by the emission unit 130 is reflected by the specimen 500. The reflection time may be a difference tre between a time ts in which the surface-reflected terahertz wave Rs is reflected by the surface 510 of the specimen 500 and received and a time tb in which the backside-reflected terahertz wave Rb is reflected by the backside 560 of the specimen 500 and received. The time ts in which the surface-reflected terahertz wave Rs is received and the time tb in which the backside-reflected terahertz wave Rb is received may be determined by feature points. The time ts in which the surface-reflected terahertz wave Rs is received and the time tb in which the backside-reflected terahertz wave Rb is received may be determined by mutually corresponding feature points. The feature points may be points at which an intensity of the surface-reflected terahertz wave Rs and an intensity of the backside-reflected terahertz wave Rb are sharply changed. The feature points may be points at which the intensity of the surface-reflected terahertz wave Rs and the intensity of the backside-reflected terahertz wave Rb deviate from a predetermined critical range. The feature points may be maximum values or minimum values of the intensity of the surface-reflected terahertz wave Rs and the intensity of the backside-reflected terahertz wave Rb.

The thickness d of the specimen 500 may be calculated by the thickness calculation unit 125 according to Equation 1 on the basis of at least one of the terahertz wave emitted by the emission unit 130, the surface-reflected terahertz wave Rs, the backside-reflected terahertz wave Rb, and the reflection time.

$$d_{layer/k} = \frac{C \cdot (t_{re_k} - t_{re_{k-1}})}{2 \cdot n_{layer/k}}$$ [Equation 1]

(C: speed of light, $d_{layer/k}$: thickness of k layer, $n_{layer/k}$: refractive index of k layer, $t_{re_k}$: reflection time of k layer, and $t_{re_{k-1}}$: reflection time of k−1 layer).

In Equation 1, k may be an order in which respective layers included in the multilayered specimen are disposed in a vertical direction. K may be an order in which the respective layers included in the multilayered specimen are spaced apart from the tray 600. A layer in which k=1 may be a lowermost layer among the respective layers included in the multilayered specimen. The layer in which k=1 may be located to be adjacent to the tray 600. In Equation 1, $d_{layer/k}$ may be a thickness of a k layer. Here, $n_{layer/k}$ may be a refractive index with respect to a material included in the k layer. Here, $t_{re_k}$ may be a reflection time of a terahertz wave with respect to the k layer. Here, $t_{re_k}$ may be a reflection time of a terahertz wave emitted toward at least one area of an upper portion of the k layer. Here, $t_{re_k}$ may be a difference between a reception time of a surface-reflected terahertz wave with respect to the k layer and a reception time of the backside-reflected wave with respect to the specimen.

The specimen 500 may have a single layer, and a thickness of the single-layered specimen 500 may be k=1. The thickness d of the specimen 500 may be calculated by the thickness calculation unit 125. The thickness calculation unit 125 may calculate the thickness d of the specimen 500 on the basis of Equation 1. The thickness calculation unit 125 may calculate the thickness d of the single-layered specimen 500 according to $$d_{layer/1} = \frac{C \cdot t_{re_1}}{2 \cdot n_{layer/1}}.$$

Accordingly, the thickness calculation unit 125 may calculate the thickness d of the single-layered specimen 500 on the basis of speed of light, the reflection time tre, and the refractive index of the specimen 500. The thickness calculation unit 125 may calculate the thickness d of the specimen 500 on the basis of the reflection time tre detected by the reception control unit 121 and the refractive index of the specimen 500 stored in the refractive index storage unit 123. The refractive index may be based on a pre-measured value. The refractive index may be calculated through an additional equation.

Figure 5:
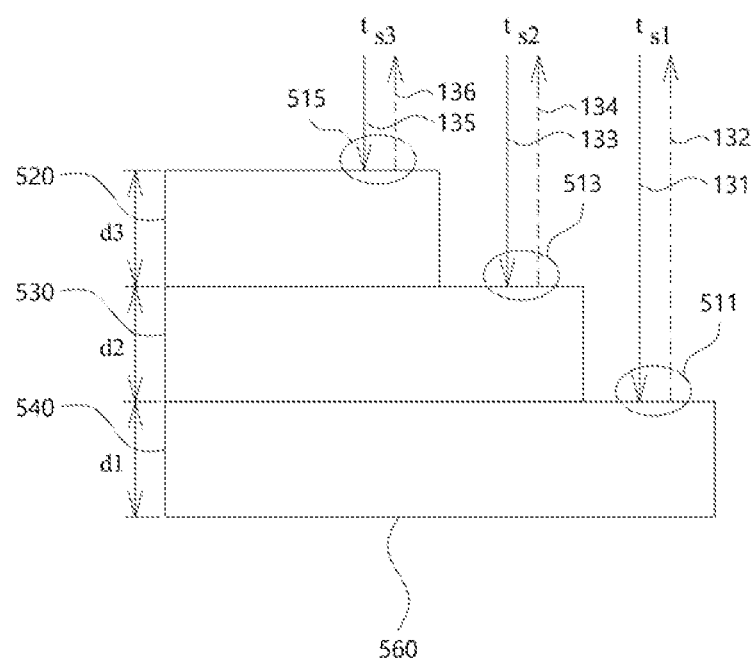
FIGS. 5 and 6 are views illustrating a method of measuring a thickness of a multilayered specimen using the specimen thickness measuring device according to one embodiment.
Figure 6:
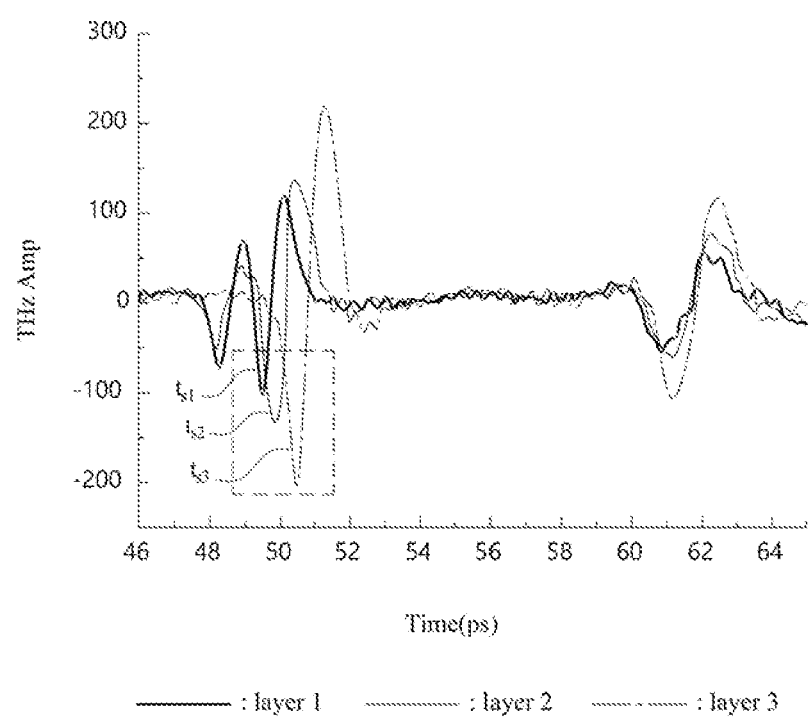

FIGS. 5 and 6 are views illustrating the multilayered specimen in the specimen thickness measuring device according to one embodiment. FIG. 5 is a view illustrating a plurality of surface-reflected terahertz waves reflected by surfaces of respective layers of the multilayered specimen, and FIG. 6 is a graph illustrating times in which the plurality of surface-reflected terahertz waves are received.

Figure 7:
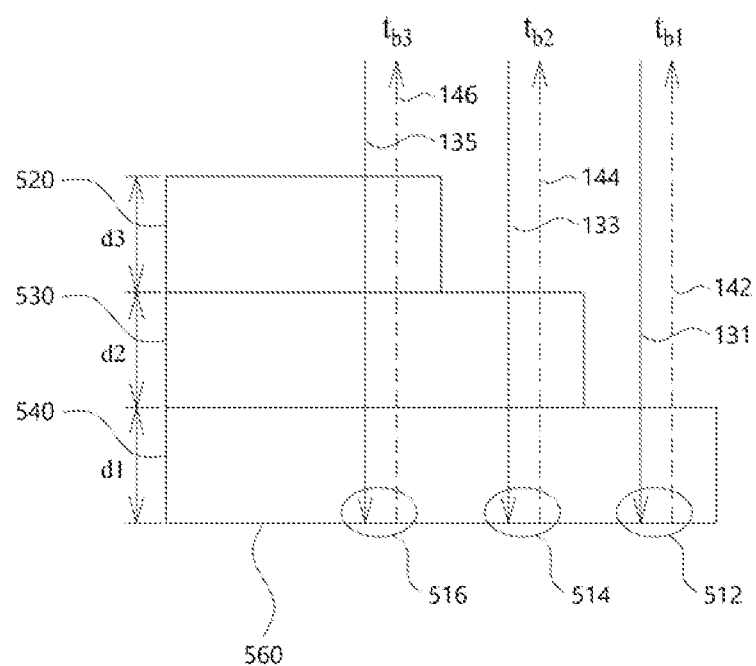
FIGS. 7 and 8 are views illustrating the multilayered specimen in the specimen thickness measuring device according to one embodiment.
Figure 8:
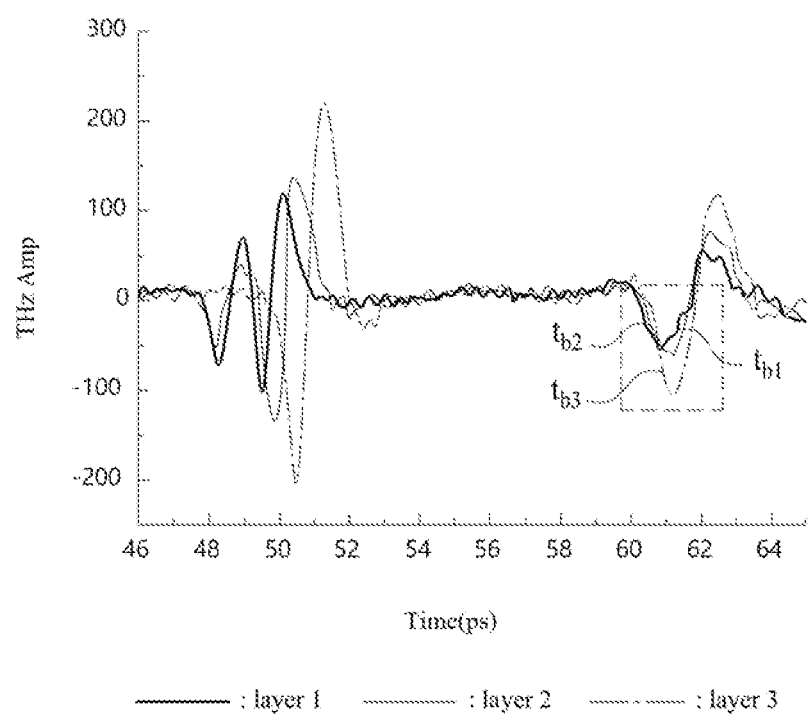

FIGS. 7 and 8 are views illustrating the multilayered specimen in the specimen thickness measuring device according to one embodiment. FIG. 7 is a view illustrating a plurality of backside-reflected terahertz waves that are terahertz waves emitted toward respective layers of the multilayered specimen and reflected by a backside of the specimen, and FIG. 8 is a graph illustrating times in which the plurality of backside-reflected waves are received.

Referring to FIGS. 1 to 8, the specimen 500 may include a third layer 520, a second layer 530, and a first layer 540. In the specimen 500, the third layer 520, the second layer 530, and the first layer 540 may be disposed in a vertical direction. In the specimen 500, the third layer 520, the second layer 530, and the first layer 540 may be disposed in a vertical direction to gradually become adjacent to the tray 600. The number of layers of the specimen 500 is not limited thereto.

The control unit 100 may calculate a thickness of each layer of the multilayered specimen 500 on the basis of a first terahertz wave 131, a second terahertz wave 133, and a third terahertz wave 135. The control unit 100 may calculate a thickness of each layer of the multilayered specimen 500 on the basis of at least one of the first terahertz wave 131, the second terahertz wave 133, and the third terahertz wave 135. The control unit 100 may calculate a thickness of each layer of the multilayered specimen 500 on the basis of at least one of a first reflected terahertz wave, a second reflected terahertz wave, and a third reflected terahertz wave. The control unit 100 may calculate a thickness of each layer of the multilayered specimen 500 on the basis of at least one of a first reflection time $t_{re_1}$, a second reflection time $t_{re_2}$, and a third reflection time $t_{re_3}$.

The control unit 100 may detect the first reflection time $t_{re_1}$ on the basis of a first surface-reflected terahertz wave 132 and a first backside-reflected terahertz wave 142, and the second reflection time $t_{re_2}$ and the third reflection time $t_{re_3}$ are detected equally. The control unit 100 may detect the first reflection time $t_{re_1}$ on the basis of a difference between a reception time $t_{re_3}$ of the first surface-reflected terahertz wave 132 and a reception time $t_{re_1}$ of the first backside-reflected terahertz wave 142, and the second reflection time $t_{re_2}$ and the third reflection time $t_{re_3}$ are detected equally.

The first terahertz wave 131 may be emitted toward the first layer 540 of the specimen 500. The first terahertz wave 131 may be emitted toward an upper portion of the first layer 540 of the specimen 500. The first terahertz wave 131 may be emitted toward a first area 511 located on the upper portion of the first layer 540 of the specimen 500. A lower portion of the second layer of the specimen may come into contact with at least a part of the upper portion of the first layer 540. The upper portion of the first layer 540 may include the first area 511 that is exposed by removing at least a part of the second layer. The first area 511 may be located on an interface between the first layer 540 and the second layer. The first area 511 may be located on an extension line of the interface between the first layer 540 and the second layer 530.

The second terahertz wave 133 may be emitted toward the second layer 530 of the specimen 500. The second terahertz wave 133 may be emitted toward an upper portion of the second layer 530 of the specimen 500. The second terahertz wave 133 may be emitted toward a second area 513 located on the upper portion of the second layer 530 of the specimen 500. The lower portion of the second layer of the specimen may come into contact with at least a part of the upper portion of the second layer 530. The upper portion of the second layer 530 may include the second area 513 exposed by removing at least a part of the second layer. The second area 513 may be located on an interface between the second layer 530 and the second layer. The second area 513 may be located on an extension line of the interface between the second layer 530 and the third layer 520.

The third terahertz wave 135 may be emitted toward the third layer 520 of the specimen 500. The third terahertz wave 135 may be emitted toward an upper portion of the third layer 520 of the specimen 500. The third terahertz wave 135 may be emitted toward a third area 515 located on the upper portion of the third layer 520 of the specimen 500. The upper portion of the third layer 520 may be exposed. The upper portion of the third layer 520 may come into contact with a lower portion of another layer. The lower portion of the other layer may come into contact with at least a part of the upper portion of the third layer 520. The upper portion of the third layer 520 may include the third area 515 exposed by removing at least a part of the other layer. The third area 515 may be located on an interface between the third layer 520 and the other layer. The third area 515 may be located on an extension line of the interface between the third layer 520 and the other layer.

The first area 511, the second area 513, and the third area 515 may differ from one another.

At least a part of the first terahertz wave 131 may be reflected by the first area 511 and form a first reflected terahertz wave. The first reflected terahertz wave may include the first surface-reflected terahertz wave 132 and the first backside-reflected terahertz wave 142. At least a part of the first terahertz wave 131 may be reflected by the first area 511 and form the first surface-reflected terahertz wave 132. The first surface-reflected terahertz wave 132 may be reflected by a surface of the first area 511 and received. At least a part of the first terahertz wave 131 may be transmitted through the first layer 540, be reflected by the backside 560 of the specimen 500, and form the first backside-reflected terahertz wave 142. The first backside-reflected terahertz wave 142 may be reflected by the backside 560 of the specimen 500 and received. The first backside-reflected terahertz wave 142 may be reflected by a position 512 of the backside 560 of the specimen 500, which corresponds to the first area 511, and be received.

At least a part of the second terahertz wave 133 may be reflected by the second area 513 and form a second reflected terahertz wave. The second reflected terahertz wave may include a second surface-reflected terahertz wave 134 and a second backside-reflected terahertz wave 144. At least a part of the second terahertz wave 133 may be reflected by the second area 513 and form the second surface-reflected terahertz wave 134. The second surface-reflected terahertz wave 134 may be reflected by a surface of the second area 513 and received. At least a part of the second terahertz wave 133 may be transmitted through the first layer 540 and the second layer 530, be reflected by the backside 560 of the specimen 500, and form the second backside-reflected terahertz wave 144. The second backside-reflected terahertz wave 144 may be reflected by the backside 560 of the specimen 500 and received. The second backside-reflected terahertz wave 144 may be reflected by a position 514 of the backside 560 of the specimen 500, which corresponds to the second area 513, and be received.

At least a part of the third terahertz wave 135 may be reflected by the third area 515 and form a third reflected terahertz wave. The third reflected terahertz wave may include a third surface-reflected terahertz wave 136 and a third backside-reflected terahertz wave 146. At least a part of the third terahertz wave 135 may be reflected by the third area 515 and form the third surface-reflected terahertz wave 136. The third surface-reflected terahertz wave 136 may be reflected by a surface of the third area 515 and received. At least a part of the third terahertz wave 135 may be transmitted through the first layer 540, the second layer 530, and the third layer 520, be reflected by the backside 560 of the specimen 500, and form the third backside-reflected terahertz wave 146. The third backside-reflected terahertz wave 146 may be reflected by the backside 560 of the specimen 500 and received. The third backside-reflected terahertz wave 146 may be reflected by a position 516 of the backside 560 of the specimen 500, which corresponds to the third area 515, and be received.

The first reflection time $t_{re_1}$ may be a time delay value of the first terahertz wave 131. The first reflection time $t_{re_1}$ may be a time in which at least a part of the first terahertz wave 131 is reflected by the first area 511 and received. The first reflection time $t_{re_1}$ may be a difference between a time $t_{s_1}$ in which the first surface-reflected terahertz wave 132 is received and a time $t_{b_1}$ in which the first backside-reflected terahertz wave 142 is received. The time $t_{s_1}$ in which the first surface-reflected terahertz wave 132 is received and the time $t_{b_1}$ in which the first backside-reflected terahertz wave 142 is received may be determined by feature points. The time $t_{s_1}$ in which the first surface-reflected terahertz wave 132 is received and the time $t_{b_1}$ in which the first backside-reflected terahertz wave 142b is received may be determined by mutually corresponding feature points. The feature points may be points at which an intensity of the first surface-reflected terahertz wave 132 and an intensity of the first backside-reflected terahertz wave 142 are sharply changed. The feature points may be points at which the intensity of the first surface-reflected terahertz wave 132 and the intensity of the first backside-reflected terahertz wave 142 deviate from a predetermined critical range. The feature points may be maximum values or minimum values of the intensity of the first surface-reflected terahertz wave 132 and the intensity of the first backside-reflected terahertz wave 142.

The second reflection time may be a time $t_{re_2}$ in which at least a part of the second terahertz wave 133 is reflected by the second area 513 and received. The second reflection time $t_{re_2}$ may be a difference between a time $t_{s_2}$ in which the second surface-reflected terahertz wave 134 is received and a time $t_{b_2}$ in which the second backside-reflected terahertz wave 144 is received. Other parts are equal to those described with the first reflection time $t_{re_2}$.

The third reflection time $t_{re_3}$ may be a time in which at least a part of the third terahertz wave 135 is reflected by the third area 515 and received. The third reflection time $t_{re_3}$ may be a difference between a time $t_{s_3}$ in which the third surface-reflected terahertz wave 136 is received and a time $t_{b_3}$ in which the third backside-reflected terahertz wave 146 is received. Other parts are equal to those described with the first reflection time $t_{re_3}$.

The thicknesses of the respective layers of the multilayered specimen 500 may include a first thickness d1, a second thickness d2, and a third thickness d3. At least one of the first thickness d1, the second thickness d2, and the third thickness d3 may be calculated by the thickness calculation unit 125 on the basis of Equation 1. According to Equation 1, the first thickness d1 may correspond to $$d_{layer/1} = \frac{C \cdot t_{re_1}}{2 \cdot n_{layer/1}} \text{ with } k = 1,$$

the second thickness d2 may correspond to $$d_{layer/2} = \frac{C \cdot (t_{re_2} - t_{re_1})}{2 \cdot n_{layer/2}} \text{ with } k = 2,$$

and the third thickness d3 may correspond to $$d_{layer/3} = \frac{C \cdot (t_{re_3} - t_{re_2})}{2 \cdot n_{layer/3}} \text{ with } k = 3.$$

The refractive index may be based on a pre-measured value. The refractive index may be calculated through an additional equation.

Accordingly, according to the specimen thickness measuring method according to the embodiment, a thickness of each layer of a single-layered or multilayered specimen may be measured. According to the specimen thickness measuring method according to the embodiment, thicknesses of respective layers may be integrally measured. Also, according to the specimen thickness measuring method, a nondestructive inspection may be performed using a terahertz wave with high transmittance. Also, pieces of information applied to Equation 1 for thickness calculation may be obtained repeatedly. When pieces of information applied to Equation 1 for thickness calculation are obtained repeatedly, the pieces of information may be applied to Equation 1 using an average of repeatedly obtained values so that the thickness of each layer of the specimen may be more precisely measured.

Figure 9:
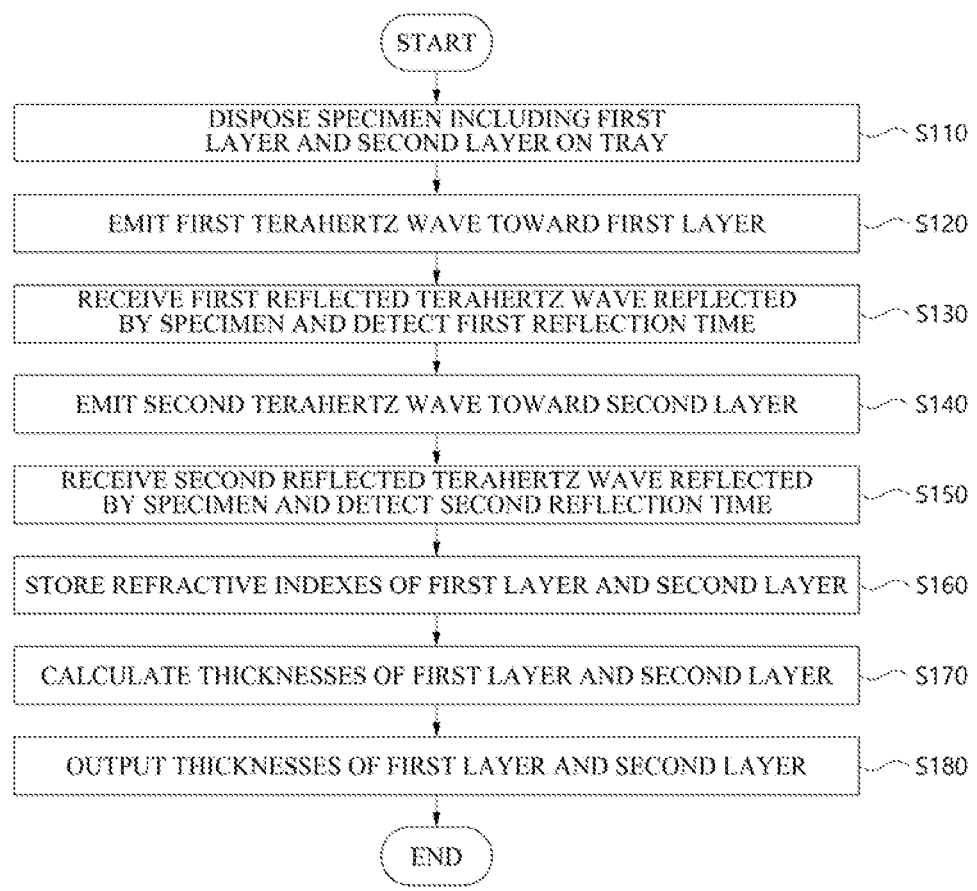
FIG. 9 is a flowchart illustrating a specimen thickness measuring method according to one embodiment.

A specimen thickness measuring method according to one embodiment of the present application will be described. FIG. 9 is a flowchart illustrating a specimen thickness measuring method according to one embodiment. Referring to FIGS. 1 to 9, the specimen thickness measuring method according to one embodiment of the present application may include disposing a specimen including the first layer 540 and the second layer 530 on a tray (S110), emitting a first terahertz wave toward the first layer 540 (S120), receiving a first reflected terahertz wave reflected by the specimen (S130), emitting a second terahertz wave toward the second layer 530 (S140), receiving a second reflected terahertz wave reflected by the specimen (S150), storing refractive indexes of the first layer 540 and the second layer 530 (S160), calculating thicknesses of the first layer 540 and the second layer 530 (S170), and outputting thickness values of the first layer 540 and the second layer 530 (S180).

In the disposing of the specimen including the first layer 540 and the second layer 530 on the tray (S110), the specimen 500 may be disposed to be located at a position corresponding to the thickness measuring device 10. The specimen 500 may be a single-layered or multilayered specimen. A plurality of such specimens 500 may be present. The tray may be controlled by the control unit 100 so that the specimen 500 is located at the position corresponding to the thickness measuring device 10.

In the emitting of the first terahertz wave toward the first layer 540 (S120), the first terahertz wave 131 may be emitted toward the first layer 540 or the emission unit 130 may emit the first terahertz wave 131 toward the first area 511 of the first layer 540. In the emitting of the first terahertz wave (S120), the emission unit 130 may emit the first terahertz wave 131 toward the first area 511 of the upper portion of the first layer 540 which is formed by removing at least a part of the second layer 530.

In the receiving of the first reflected terahertz wave reflected by the specimen and in detecting a first reflection time (S130), the first reflected terahertz wave that is the first terahertz wave 131 emitted toward and reflected by the first layer 540 may be received by the reception unit 160 and the reception control unit 121 may detect a first reflection time $t_{re_1}$ on the basis of the received first reflected terahertz wave. In the receiving of the first reflected terahertz wave and in detecting of the first reception time (S130), the reception unit 160 may receive the first surface-reflected terahertz wave 132 reflected by a surface of the first area 511 and the first backside-reflected terahertz wave 142 reflected by the backside 560 of the specimen 500 and the reception control unit 121 may detect the first reflection time $t_{re_1}$ using a difference between a reception time $t_{re_1}$ of the first surface-reflected terahertz wave 132 and a reception time $t_{b_1}$ of the first backside-reflected terahertz wave 142.

In the emitting of the second terahertz wave toward the second layer 530 (S140), the second terahertz wave 133 may be emitted toward the second layer 530 or the emission unit 130 may emit the second terahertz wave 133 toward the second area 513 of the second layer 530.

In the receiving of the second reflected terahertz wave reflected by the specimen and in detecting a second reflection time (S150), the second reflected terahertz wave that is the second terahertz wave 133 emitted toward and reflected by the second layer 530 may be received by the reception unit 160 and the reception control unit 121 may detect a second reflection time $t_{re_2}$ using the received second reflected terahertz wave. In the receiving of the second reflected terahertz wave and in detecting of the second reception time (S150), the reception unit 160 may receive the second surface-reflected terahertz wave 134 reflected by a surface of the second area 513 and the second backside-reflected terahertz wave 144 reflected by the backside 560 of the specimen 500 and the reception control unit 121 may detect the second reflection time $t_{re_2}$ using a difference between a reception time $t_{s_2}$ of the second surface-reflected terahertz wave 134 and a reception time $t_{b_2}$ of the second backside-reflected terahertz wave 144.

In the storing of the refractive indexes of the first layer 540 and the second layer 530 (S160), the refractive indexes of the first layer 540 and the second layer 530 may be stored. The refractive indexes with respect to the first layer 540 and the second layer 530 may be predetermined refractive indexes. The refractive indexes with respect to the first layer 540 and the second layer 530 may be pre-obtained refractive indexes. The refractive indexes with respect to the first layer 540 and the second layer 530 may be calculated with a thickness measurement.

In the calculating of the thicknesses of the first layer 540 and the second layer 530 (S170), the thickness calculation unit 125 may calculate the thicknesses of the first layer 540 and the second layer 530 on the basis of at least one of the first reflection time $t_{re_1}$ in which the first reflected terahertz wave is reflected and received, the second reflection time $t_{re_2}$ in which the second reflected terahertz wave is reflected and received, and the refractive indexes of the respective layers.

In the outputting of the thickness values of the first layer 540 and the second layer 530 (S180), values of the thicknesses of the respective layers calculated by the thickness calculation unit 125 in the calculating of the thicknesses of the first layer and the second layer 530 (S170) may be output. In the outputting of the thickness values of the first layer 540 and the second layer 530 (S180), the output thickness values of the respective layers may be average values of the thickness values of the respective layer calculated in the calculating of the thicknesses (S170).

A sequence of the specimen thickness measuring method of FIG. 9 is not limited to a sequence of the operations shown in FIG. 9.

Figure 10:
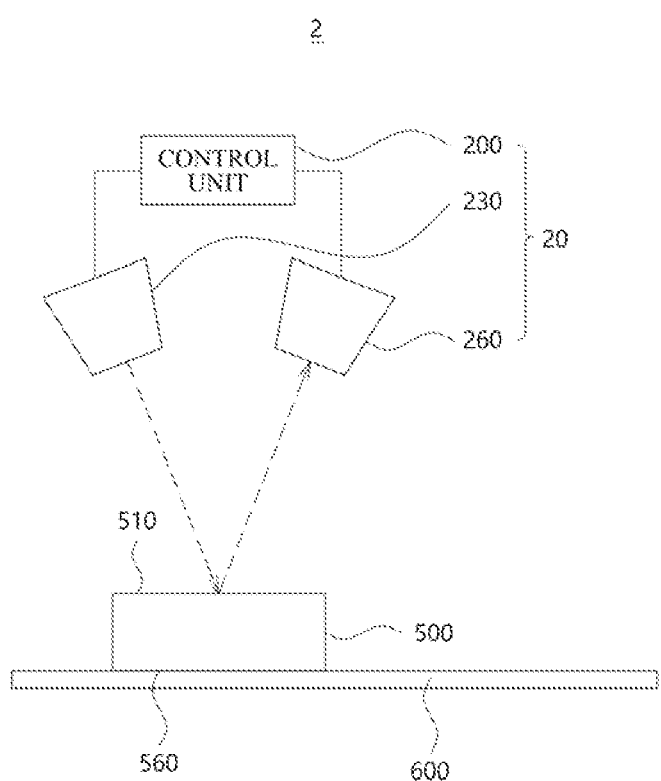
FIG. 10 is a view illustrating a specimen thickness measuring system according to one embodiment.

A specimen thickness measuring system according to one embodiment of the present application will be described. FIG. 10 is a view illustrating the specimen thickness measuring system according to one embodiment.

The specimen thickness measuring system 2 may include a specimen thickness measuring device 20, the specimen 500, and the tray 600. A description of the specimen thickness measuring system 2 is equal to content of the specimen thickness measuring system 1 shown in FIGS. 1 and 2.

The specimen thickness measuring device 20 may include a control unit 200, an emission unit 230, and a reception unit 260. A description of components of the specimen thickness measuring device 20 is equal to that of the specimen thickness measuring device 10 excluding the beam splitter 190 included in the thickness measuring device 10.

The emission unit 230 may face the tray 600. The emission unit 230 may be located above the tray 600. The emission unit 230 may be located while being spaced diagonally apart from the tray 600. The reception unit 260 may be located above the tray 600. The reception unit 260 may be located while being spaced diagonally apart from the tray 600. The reception unit 260 may be located on a path through which the terahertz wave reflected by the tray 600 is reflected above the tray 600.

The light emitted by the emission unit 230 may be emitted toward the tray 600. At least a part of the light emitted toward the tray 600 may be reflected by the tray 600. At least the part of the light emitted toward the tray 600 may be reflected by the surface 510 of the specimen 500 disposed on the tray 600. At least a part of the light emitted toward the tray 600 may be transmitted through the specimen 500. At least the part of the light transmitted through the tray 600 may be reflected by the backside 560 of the specimen 500 disposed on the tray 600. At least a part of the light reflected by the backside 560 of the specimen 500 may be transmitted through the specimen 500. The light transmitted through the specimen 500 may be received by the reception unit 260.

Figure 11:
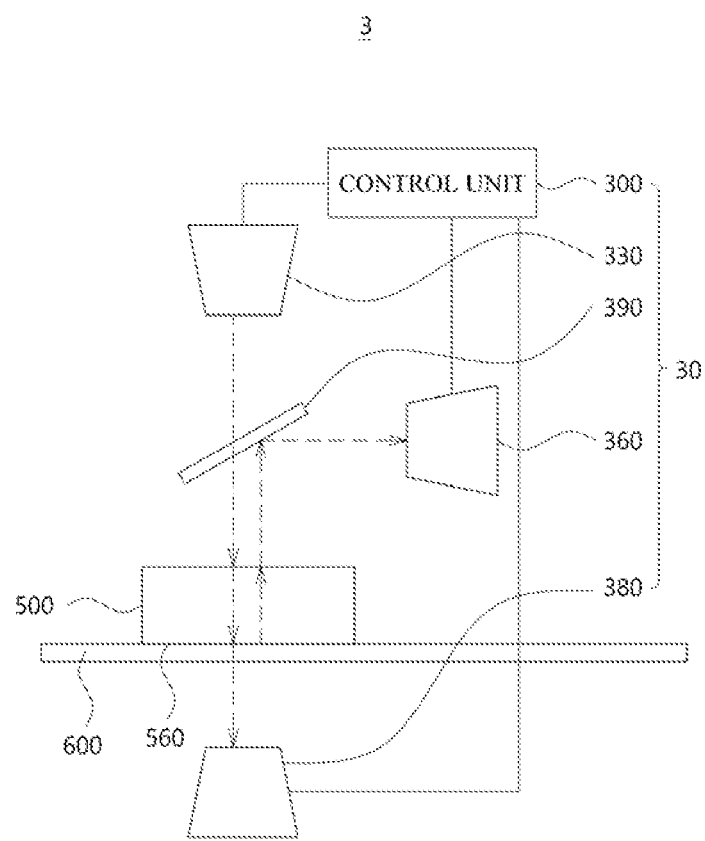
FIG. 11 is a view illustrating a specimen thickness measuring system configured to measure a refractive index and a thickness of each layer of a specimen according to one embodiment.

A specimen thickness measuring system according to one embodiment of the present application will be described. FIG. 11 is a view illustrating a specimen thickness measuring system 3 configured to measure a refractive index and a thickness of each layer of a specimen according to one embodiment.

Referring to FIG. 11, the specimen thickness measuring system 3 may include a specimen thickness measuring device 30, the specimen 500, and the tray 600.

The specimen thickness measuring system 3 may measure a refractive index and a thickness of the specimen 500 disposed on the tray 600. The specimen thickness measuring system 3 may measure a thickness and a refractive index of each layer of the multilayered specimen 500 disposed on the tray 600. The specimen thickness measuring device 30 may measure the thickness and the refractive index of the specimen 500 disposed on the tray 600. The specimen thickness measuring device 30 may measure the thickness and the refractive index of the specimen 500 disposed on the tray 600 that is being moved.

Referring to FIG. 11, the specimen thickness measuring device 30 may include a control unit 300, an emission unit 330, a first reception unit 360, a second reception unit 380, and a beam splitter 390.

The control unit 300 may control the emission unit 130, the first reception unit 360, and the second reception unit 380. The control unit 300 may also control the beam splitter 390. The emission unit 330 may face the tray 600. The emission unit 330 may be located above the tray 600. The emission unit 330 may be located while being spaced vertically apart from the tray 600. The beam splitter 390 may be located between the emission unit 330 and the tray 600. The beam splitter 390 may be located on a path of a terahertz wave emitted from the emission unit 330 toward the tray 600. The first reception unit 360 may be located while being spaced apart from the beam splitter 390. The first reception unit 360 may be located on a path through which the terahertz wave reflected by the tray 600 is reflected by the beam splitter. The second reception unit 380 may be located below the tray 600. The second reception unit 380 may be located below the tray 600 at a position corresponding to the emission unit 330. The beam splitter 390 may be located between the second reception unit 380 and the emission unit 330. The second reception unit 380 may be located on a path through which light emitted from the emission unit 330 is transmitted through the tray 600.

Hereinafter, each component will be described.

The emission unit 330, the first reception unit 360, the second reception unit 380, and the beam splitter 390 will be described with reference to FIG. 11.

Content with respect to the emission unit 330 is equal to the description with respect to the emission unit 130 shown in FIG. 1. Content with respect to the beam splitter 390 is equal to the description with respect to the beam splitter 190 shown in FIG. 1.

The first reception unit 360 may receive a reflected terahertz wave that is the terahertz wave emitted by the emission unit 330 and reflected by the specimen 500 on the tray 600. Content with respect to the first reception unit 360 is equal to the description with respect to the reception unit 160 shown in FIGS. 1 and 2.

The second reception unit 380 may receive a transmitted terahertz wave that is the terahertz wave emitted by the emission unit 330 and transmitted through the tray 600. The second reception unit 380 may receive a transmitted terahertz wave that is the terahertz wave emitted by the emission unit 330 and transmitted through the specimen 500 disposed on the tray 600. The second reception unit 380 may receive a transmitted terahertz wave that is the terahertz wave transmitted through the tray 600 while the specimen 500 is removed.

The light emitted by the emission unit 330 may be emitted toward the beam splitter 390. At least a part of the light emitted by the emission unit 330 may be transmitted through the beam splitter 190. The light transmitted through the beam splitter 390 from the emission unit 330 may be emitted toward the tray 600.

At least a part of the light emitted toward the tray 600 may be reflected by the tray 600. At least the part of the light emitted toward the tray 600 may be reflected by the surface 510 of the specimen 500 disposed on the tray 600. At least the part of the light emitted toward the tray 600 may be reflected by the surface 510 of the specimen 500 disposed on the tray 600. At least a part of the light emitted toward the tray 600 may be transmitted through the specimen 500. At least the part of the light transmitted through the tray 600 may be reflected by the backside 560 of the specimen 500 disposed on the tray 600. At least a part of the light reflected by the backside 560 of the specimen 500 may be transmitted through the specimen 500. The light transmitted through the specimen 500 may be emitted toward the beam splitter 390. At least a part of the light reflected by the tray 600 may be reflected by the beam splitter 390. The light reflected by the beam splitter 390 may be received by the first reception unit 360.

At least a part of the light emitted toward the tray 600 may be transmitted through the beam splitter 390. At least a part of light transmitted through the beam splitter 390 may be emitted toward the tray 600. At least a part of the light emitted toward the tray 600 may be transmitted through the tray 600. At least a part of the light emitted toward the tray 600 may be transmitted through the specimen 500 disposed on the tray 600. At least a part of the light emitted toward the tray 600 may be transmitted through the specimen 500 and the tray 600. At least a part of light transmitted through the tray 600 may be received by the second reception unit 380.

At least a part of light transmitted through the specimen 500 and the tray 600 may be received by the second reception unit 380.

The specimen 500 and the tray 600 will be described with reference to FIG. 11. However, content with respect to the specimen 500 is equal to that described above.

One or a plurality of specimens 500 may be located on the tray 600. The specimen 500 disposed on the tray 600 may include a single layer or multiple layers. The tray 600 may be transferred, by an additional transfer unit, to a position corresponding to the emission unit 330. The tray 600 may be transferred at a certain speed, by the transfer unit, to the position corresponding to the emission unit 330. The tray 600 may include a material capable of reflecting or transmitting light emitted by the emission unit 330. The tray 600 may include a material capable of reflecting the terahertz wave emitted by the emission unit 330. When at least some terahertz waves emitted by the emission unit 330 are transmitted through the specimen 500 and reach the tray 600, the tray 600 may reflect at least some terahertz waves transmitted through the specimen. Also, when at least some terahertz waves emitted by the emission unit 330 are transmitted through the specimen 500 and reach the tray 600, the tray 600 may transmit at least some terahertz waves transmitted through the specimen.

Figure 12:
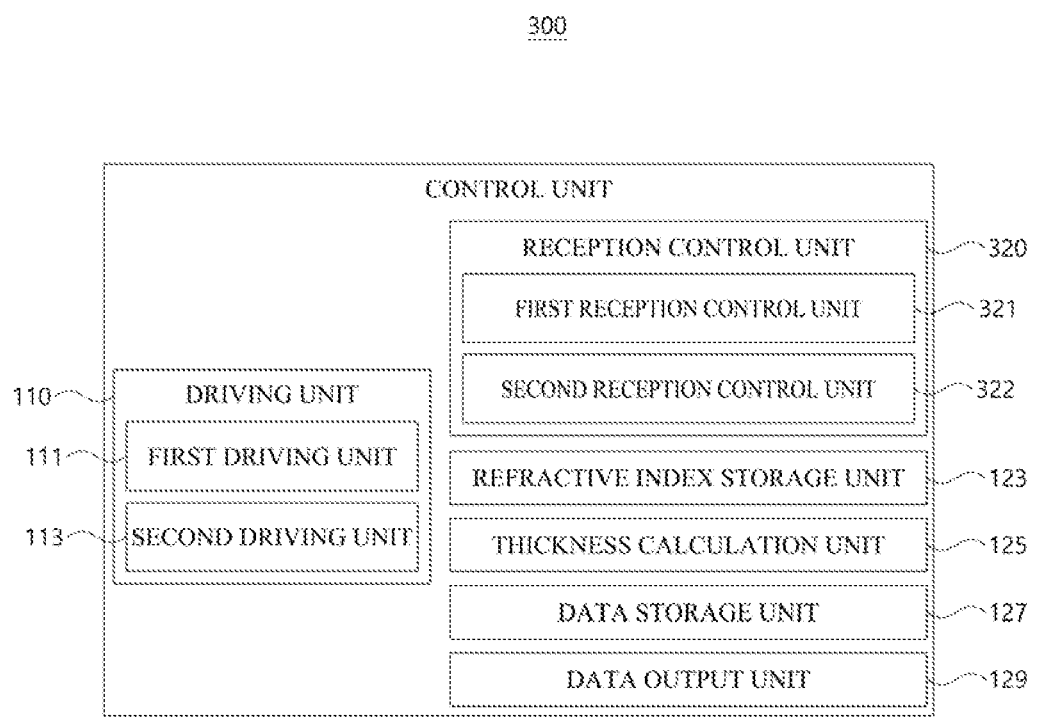
FIG. 12 is a view illustrating a control unit configured to control a specimen thickness measuring device according to one embodiment.

FIG. 12 is a block diagram illustrating the control unit configured to control the specimen thickness measuring device according to one embodiment. Referring to FIG. 12, the control unit 300 may include a driving unit 310, a reception control unit 320, a refractive index storage unit 323, a thickness calculation unit 325, a data storage unit 327, and a data output unit 329.

The control unit 300 will be described with reference to FIGS. 11 and 12.

The driving unit 310 may drive the specimen thickness measuring system 3. The driving unit 310 may drive the specimen thickness measuring device 30 or drive the tray 600 to move. The driving unit 310 may include a first driving unit 311 and a second driving unit 313. A detailed description of the driving unit 310 is equal to that of the driving unit 110 shown in FIGS. 1 and 2.

The reception control unit 320 may control at least one of the first reception unit 360 and the second reception unit 380 to receive the terahertz wave emitted from the emission unit 330. The reception control unit 320 may include a first reception control unit 321 and a second reception control unit 322. The first reception control unit 321 is equal to content disclosed with respect to the reception unit 160 and the reception control unit 121 shown in FIGS. 1 and 2.

The second reception control unit 322 may control the second reception unit 380 to receive a transmitted terahertz wave that is the terahertz wave emitted by the emission unit 330 and transmitted through the specimen 500. The second reception control unit 322 may control the second reception unit 380 to receive a transmitted terahertz wave that is the terahertz wave emitted by the emission unit 330 and transmitted through the specimen 500 and the tray 600. The second reception control unit 322 may measure a transmission time on the basis of the transmitted terahertz wave received by the second reception unit 380. The second reception control unit 322 may measure a reception time of the transmitted terahertz wave transmitted through the specimen 500 on the basis of the transmitted terahertz wave received by the second reception unit 380 and a reception time of the transmitted terahertz wave transmitted through the tray 600 from which the specimen 500 is removed. The second reception control unit 322 may measure a difference between the reception time of the transmitted terahertz wave transmitted through the specimen 500 on the basis of the transmitted terahertz wave received by the second reception unit 380 and the reception time of the transmitted terahertz wave transmitted through the tray 600 from which the specimen 500 is removed.

The refractive index storage unit 323 may include content described with respect to the refractive index storage unit 123 shown in FIGS. 1 and 2. Also, the refractive index storage unit 323 may obtain and store a refractive index with respect to any one of respective layers included in the specimen 500 on the basis of the reflection time measured by the first reception unit and the transmission time measured by the second reception unit.

The thickness calculation unit 325 is equal to content described with respect to the thickness calculation unit 125 shown in FIG. 2. The data storage unit 327 is equal to content described with respect to the data storage unit 127 shown in FIG. 2. The data output unit 329 is equal to content described with respect to the data output unit 129 shown in FIG. 2.

Figure 13:
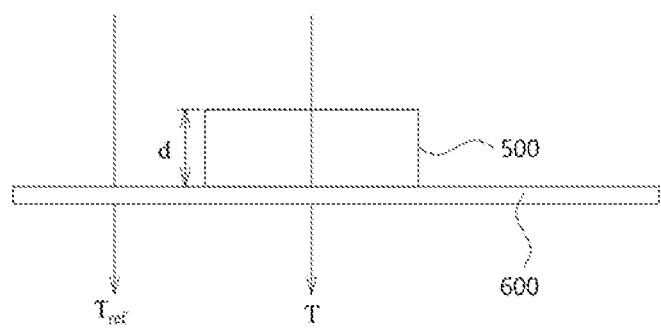
FIGS. 13 and 14 are views illustrating a method of measuring a refractive index and a thickness of a single-layered specimen using the specimen thickness measuring device according to one embodiment.
Figure 14:
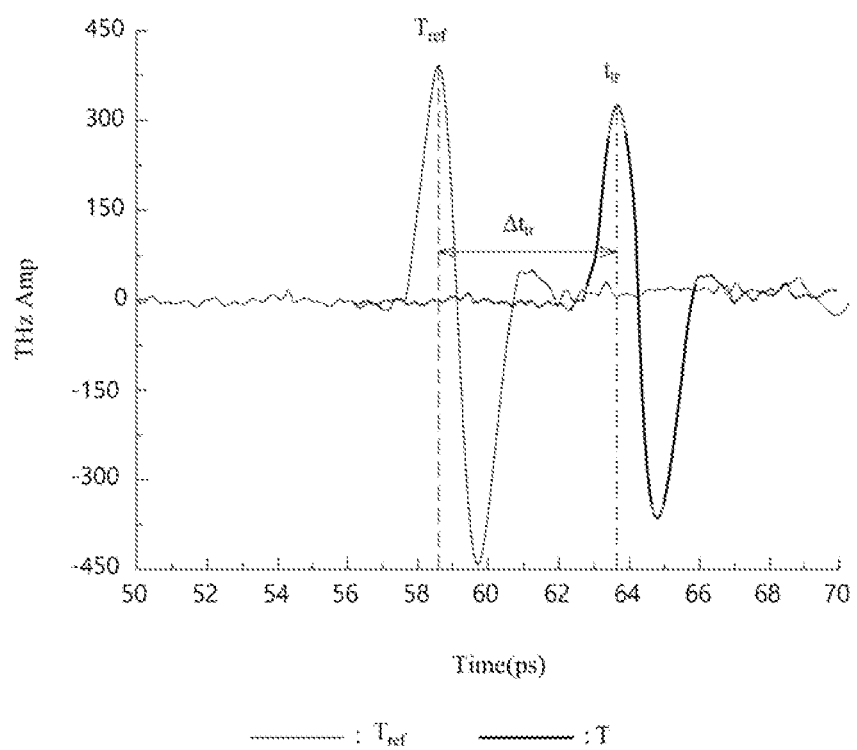

FIGS. 13 and 14 are views illustrating a single-layered specimen in the specimen thickness measuring device according to one embodiment. FIG. 13 is a view illustrating a transmitted terahertz wave transmitted through the specimen and a transmitted terahertz wave transmitted through while the specimen is removed, and FIG. 14 is a view illustrating a difference between reception times of the transmitted terahertz waves.

A method of measuring, by the specimen thickness measuring device 30, a refractive index and a thickness d of the specimen 500 will be described with reference to FIGS. 11 to 14.

Referring to FIGS. 3, 4, and 11 to 14, the control unit 300 may measure the thickness d of the specimen 500 on the basis of a terahertz wave emitted by the emission unit 330. The control unit 300 may measure the refractive index and the thickness d of the specimen 500 on the basis of at least one of a surface-reflected terahertz wave Rs, a backside-reflected terahertz wave Rb, a transmitted terahertz wave T transmitted through the specimen, a reference terahertz wave $T_{rej}$ transmitted through the tray without the specimen, a reflection time $t_{re}$, and a transmission time $t_{tr}$. The control unit 300 may measure the refractive index and the thickness d of the specimen 500 on the basis of a difference between a reception time of the surface-reflected terahertz wave Rs and a reception time of the backside-reflected terahertz wave Rb and a difference between a reception time of the transmitted terahertz wave T transmitted through the specimen and a reception time of the reference terahertz wave $T_{rej}$ transmitted through the tray without the specimen.

Contents of the surface-reflected terahertz wave Rs, the backside-reflected terahertz wave Rb, and the reflection time tre are equal to those described above.

The transmitted terahertz wave T transmitted through the specimen 500 may be at least some terahertz waves emitted from the emission unit 330 and transmitted through the specimen. The transmitted terahertz wave T may be transmitted through the specimen 500 and received. A reference transmitted terahertz wave $T_{rej}$ transmitted through the tray 600 from which the specimen 500 is removed may be at least some terahertz waves emitted from the emission unit 330 and transmitted through the tray 600 from which the specimen 500 is removed. The reference transmitted terahertz wave $T_{rej}$ may be transmitted through the tray 600 and received.

The transmission time may be a difference between a time $t_{tr}$ in which the transmitted terahertz wave T is transmitted through the specimen 500 and received and a time $t_{rej}$ in which the reference transmitted terahertz wave $T_{rej}$ is transmitted through the tray 600 and received. The time $t_{tr}$ in which the transmitted terahertz wave T is transmitted through the specimen 500 and received and the time $t_{rej}$ in which the reference transmitted terahertz wave $T_{rej}$ is transmitted through the tray 600 and received may be determined by feature points. The time $t_{tr}$ in which the transmitted terahertz wave T is transmitted through the specimen 500 and received and the time $t_{rej}$ in which the reference transmitted terahertz wave $T_{rej}$ is transmitted through the tray 600 and received may be determined by mutually corresponding feature points. The feature points may be points at which an intensity of the transmitted terahertz wave T and an intensity of the reference transmitted terahertz wave $T_{rej}$ are sharply changed. The feature points may be points at which the intensity of the transmitted terahertz wave T and the intensity of the reference transmitted terahertz wave $T_{rej}$ deviate from a critical range. The feature points may be maximum values or minimum values of the intensity of the transmitted terahertz wave T and the intensity of the reference transmitted terahertz wave $T_{rej}$.

A method of measuring the thickness d of the specimen 500 may include content calculable using Equation 1. The thickness d of the specimen 500 may be calculated using another method in addition to Equation 1 based on the surface-reflected terahertz wave Rs, the backside-reflected terahertz wave Rb, and the reflection time $t_{re}$. The thickness d of the specimen 500 may be calculated on the basis of the transmitted terahertz wave T, the reference terahertz wave $T_{rej}$, the transmission time $t_{tr}$, and the refractive index. The thickness d of the specimen 500 may be calculated on the basis of Equation 2.

$$d_{layer/k} = \frac{C \cdot (t_{tr_k} - t_{tr_{k-1}})}{n_{layer/k} - 1} \quad \text{[Equation 2]}$$

(C: speed of light, $d_{layer/k}$: thickness of k layer, $n_{layer/k}$: refractive index of k layer, $t_{tr_k}$: transmission time of k layer, and $t_{tr_{k-1}}$: transmission time of k-1 layer).

In Equation 2, k may be an order in which respective layers included in the multilayered specimen are disposed in a vertical direction. K may be an order in which the respective layers included in the multilayered specimen are spaced apart from the tray 600. A layer in which k=1 may be a lowermost layer among the respective layers included in the multilayered specimen. The layer in which k=1 may be located to be adjacent to the tray 600. In Equation 2, $d_{layer/k}$ may be a thickness of a k layer. Here, $n_{layer/k}$: a refractive index of the k layer may be a refractive index with respect to a material included in the k layer. Here, $t_{tr_k}$ may be a transmission time of a terahertz wave with respect to the k layer. Here, $t_{tr_k}$ may be a transmission time of a terahertz wave emitted toward at least one area of an upper portion of the k layer. Here, $t_{tr_k}$ may be a difference between the transmission time of the terahertz wave with respect to the k layer and a transmission time of the terahertz wave with respect to the tray 600.

The specimen 500 may have a single layer, and a thickness of the single-layered specimen 500 may be k=1. The thickness of the specimen 500 may be calculated by the thickness calculation unit 325. The thickness calculation unit 325 may calculate the thickness d of the specimen 500 on the basis of Equation 2. The thickness calculation unit 325 may calculate the thickness d of the single-layered specimen 500 according to $$d_{layer/1} = \frac{C \cdot t_{tr_k}}{n_{layer/1} - 1}.$$

Accordingly, the thickness calculation unit 325 may calculate the thickness d of the single-layered specimen 500 on the basis of the speed of light, the transmission time $t_{tr}$, and the refractive index of the specimen 500. The thickness calculation unit 325 may calculate the thickness d of the specimen 500 on the basis of the transmission time $t_{tr}$ detected by the reception control unit 320 and the refractive index of the specimen 500 stored in the refractive index storage unit 323. The refractive index may be based on a pre-measured value. The refractive index may be calculated through an additional equation.

Referring to FIGS. 3, 4, and 11 to 14, in the specimen thickness measuring device 30, the control unit 300 may calculate the refractive index of the specimen 500 on the basis of at least one of the terahertz wave emitted by the emission unit 330, the surface-reflected terahertz wave Rs, the backside-reflected terahertz wave Rb, the transmitted terahertz wave T, the reference transmitted terahertz wave $t_{rej}$, the reflection time $t_{re}$, and the transmission time $t_{tr}$. The control unit 300 may derive Equation 3 capable of calculating the refractive index with respect to each layer of the specimen 500 from Equation 1 and Equation 2. The control unit 300 may calculate the refractive index of the specimen 500 on the basis of Equation 3.

$$n_{layer/k} = \frac{1}{1 - 2 \cdot \frac{(t_{tr_k} - t_{tr_{k-1}})}{(t_{re_k} - t_{re_{k-1}})}}$$ [Equation 3]

$n_{layer/k}$: refractive index of k layer, $t_{re_k}$: reflection time of k layer, $t_{re_{k-1}}$: reflection time of k−1 layer, $t_{tr_k}$: transmission time of k layer, and $t_{tr_{k-1}}$: transmission time of k−1 layer.

In Equation 3, k may be an order in which respective layers included in the multilayered specimen are disposed in a vertical direction. K may be an order in which the respective layers included in the multilayered specimen are spaced apart from the tray 600. A layer in which k=1 may be a lowermost layer among the respective layers included in the multilayered specimen. The layer in which k=1 may be located to be adjacent to the tray 600. In Equation 2, may be a thickness of a k layer. Here, $n_{layer/k}$: a refractive index of the k layer may be a refractive index with respect to a material included in the k layer. Here, $t_{re_k}$ may be a reflection time of a terahertz wave with respect to the k layer. Here, $t_{re_k}$ may be a difference between a reception time of a surface-reflected terahertz wave with respect to the k layer and a reception time of the backside-reflected wave with respect to the k layer. Here, $t_{tr_k}$ may be a transmission time of a terahertz wave with respect to the k layer. Here, $t_{tr_k}$ may be a difference between the transmission time of the terahertz wave with respect to the k layer and a transmission time of the terahertz wave with respect to the tray 600.

The specimen 500 may have a single layer, and a refractive index of the single-layered specimen 500 may be k=1. The refractive index of the specimen 500 may be calculated by the control unit 300. The control unit 300 may calculate the refractive index of the specimen 500 on the basis of Equation 3. The control unit 300 may calculate the refractive index of the single-layered specimen 500 through $$n_{layer/1} = \frac{1}{1 - 2 \cdot \frac{t_{tr_1}}{t_{re_1}}}.$$

Accordingly, the refractive index of the specimen 500 may be calculated on the basis of the reflection time $t_{re}$ and the transmission time $t_{tr}$. That is, even when the refractive index of the specimen 500 is not known, the refractive index of the specimen 500 may be calculated when the reflection time $t_{re}$ and the transmission time $t_{tr}$ are known.

Accordingly, the control unit 300 may apply the refractive index of the specimen 500 calculated on the basis of Equation 3 to Equation 1 or Equation 2. The control unit 300 may calculate the thickness d of the specimen 500 by applying the refractive index of the specimen 500 calculated on the basis of Equation 3 to Equation 1 or Equation 2.

Figure 15:
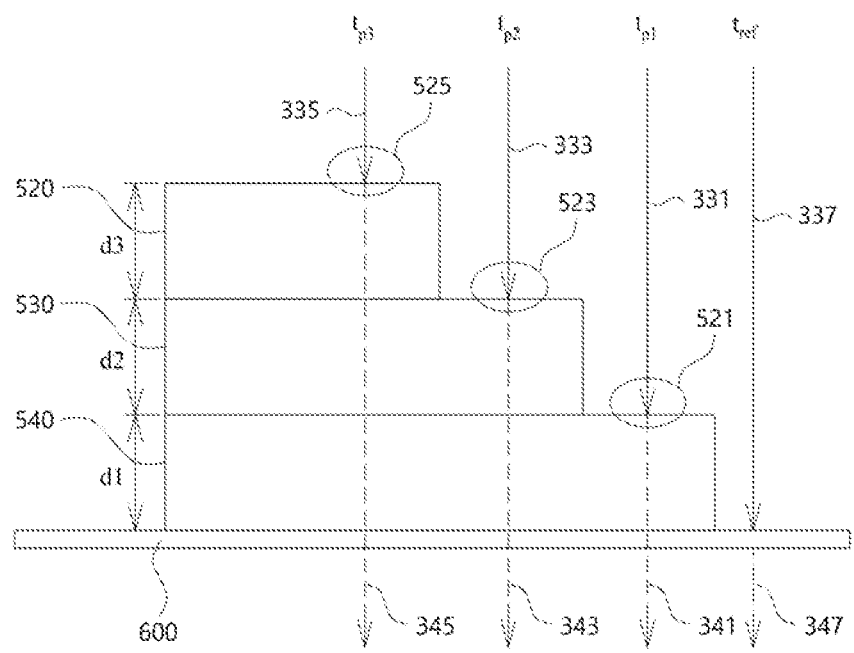
FIGS. 15 and 16 are views illustrating a method of measuring refractive indexes thicknesses of a multilayered specimen using the specimen thickness measuring device according to one embodiment.
Figure 16:
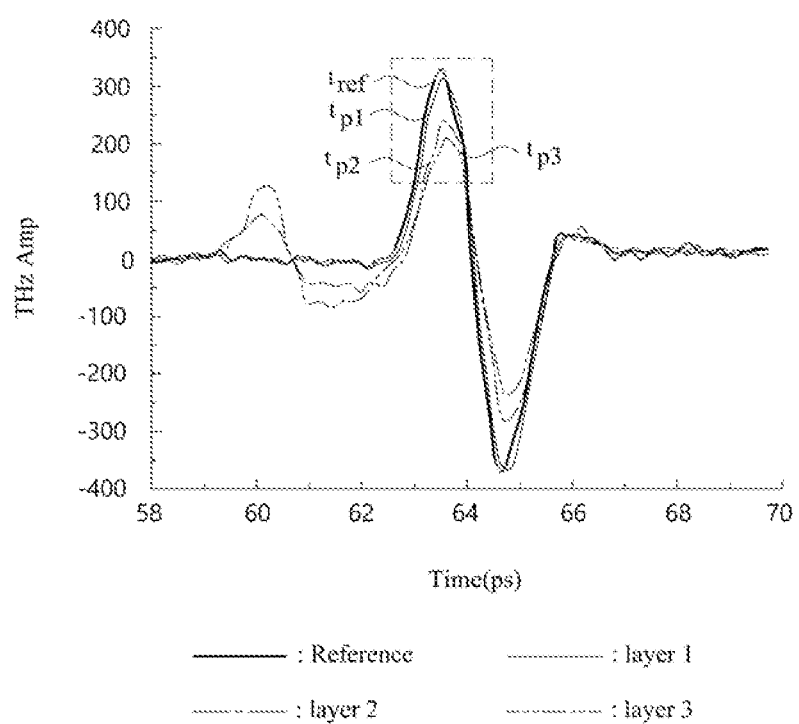

FIGS. 15 and 16 are views illustrating the multilayered specimen in the specimen thickness measuring device according to one embodiment. FIG. 15 is a view illustrating a plurality of transmitted terahertz waves transmitted through the respective layers of the multilayered specimen and a transmitted terahertz wave transmitted while the specimen is removed. FIG. 16 is a graph illustrating times in which the plurality of transmitted terahertz waves are received.

Referring to FIGS. 1 to 16, the control unit 300 may measure the refractive index and the thickness d of the multilayered specimen 500 on the basis of a first terahertz wave 331, a second terahertz wave 333, and a third terahertz wave 335 which are emitted by the emission unit 330. The control unit 300 may measure a thickness of at least any one of the respective layers of the specimen 500 on the basis of at least one of the first terahertz wave 331, the second terahertz wave 333, the third terahertz wave 335, a first reflection time $t_{re_1}$, a second reflection time $t_{re_2}$, a third reflection time $t_{re_3}$, the first transmission time $t_{tr_1}$, the second transmission time $t_{tr_2}$, and the third transmission time $t_{tr_3}$.

The first terahertz wave 331 may be emitted toward the first layer 540 of the specimen. The first terahertz wave 331 may be emitted toward an upper portion of the first layer 540 of the specimen. The first terahertz wave 331 may be emitted toward a fourth area 521 located on the upper portion of the first layer 540 of the specimen. A lower portion of the second layer 530 of the specimen may come into contact with at least a part of the upper portion of the first layer 540. The upper portion of the first layer 540 may include the fourth area 521 formed by removing at least a part of the second layer 530. The fourth area 521 may be located on an interface between the first layer 540 and the second layer 530. The fourth area 521 may be located on an extension line of the interface between the first layer 540 and the second layer 530.

The second terahertz wave 333 may be emitted toward the second layer of the specimen. The second terahertz wave 333 may be emitted toward an upper portion of the second layer 530 of the specimen. The second terahertz wave 333 may be emitted toward a fifth area 523 located on the upper portion of the second layer 530 of the specimen. A lower portion of the third layer 520 of the specimen may come into contact with at least a part of the upper portion of the second layer 540. The upper portion of the second layer 530 may include the fifth area 523 formed by removing at least a part of the third layer 520. The fifth area 523 may be located on an interface between the second layer 530 and the third layer 520. The fifth area 523 may be located on an extension line of the interface between the second layer 530 and the third layer 520. The entire third layer 520 may be removed from the upper portion of the second layer 530 of the specimen. All additional layers may be removed from the upper portion of the second layer 530 of the specimen.

The third terahertz wave 335 may be emitted toward the third layer 520 of the specimen or toward an upper portion of the third layer. The third terahertz wave 335 may be emitted toward a sixth area 525 located on the upper portion of the third layer of the specimen. The upper portion of the third layer 520 of the specimen may come into contact with at least a part of a lower portion of another layer. The upper portion of the third layer 520 may include the sixth area 525 formed by removing at least a part of the lower portion of the other layer. The additional other layer may be removed from the upper portion of the third layer 520 of the specimen.

The fourth area 521, the fifth area 523, and the sixth area 525 may differ from one another. Referring to FIGS. 6 to 12, the fourth area 521, the fifth area 523, and the sixth area 525 may differ from the first area 511, the second area 513, and the third area 515, respectively. At least one of the fourth area 521, the fifth area 523, and the sixth area 525 may coincide with the first area 511, the second area 513, and the third area 515.

Content with respect to reflected terahertz waves reflected by the specimen 500 and reflection times of the first terahertz wave 331, the second terahertz wave 333, and the third terahertz wave 335 is equal to the above content described with reference to FIGS. 6 to 12.

At least a part of the first terahertz wave 331 may be emitted toward the fourth area 521 and transmitted through the specimen 500 so as to form a first transmitted terahertz wave 341. The first transmitted terahertz wave 341 may be transmitted through the fourth area 521 and received. At least a part of the first transmitted terahertz wave 341 may be transmitted through the specimen 500 and the tray 600 and received. The first transmitted terahertz wave 341 may be transmitted through a position of the backside 560 of the specimen 500, which corresponds to the fourth area 521, and be received.

At least a part of the second terahertz wave 333 may be emitted toward the fifth area 523 and transmitted through the specimen 500 so as to form a second transmitted terahertz wave 343, and additional content is equal to the content described with respect to the first transmitted terahertz wave 341. At least a part of the third terahertz wave 335 may be emitted toward the fourth area 521 and transmitted through the specimen 500 so as to form the first transmitted terahertz wave 341, and additional content is equal to the content described with respect to the first transmitted terahertz wave 341.

The fourth terahertz wave 337 may be emitted toward the tray 600 from which the specimen 500 is removed and may form a reference transmitted terahertz wave 347 transmitted through the tray 600. The fourth terahertz wave 337 may be emitted while both the specimen 500 and the tray 600 are removed.

The first transmission time $t_{tr_1}$ may be a time delay value of the first terahertz wave 331. The first transmission time $t_{tr_1}$ may be a difference between a time $t_{p_1}$ in which the first transmitted terahertz wave 341 is received and a time $t_{rej}$ in which the fourth transmitted terahertz wave 347 is received. The first transmission time $t_{tr_1}$ may be determined using positions of feature points of the time $t_{p_1}$ in which the first transmitted terahertz wave 341 is received and the time $t_{rej}$ in which the fourth transmitted terahertz wave 347 is received. The first transmission time $t_{tr_1}$ may be determined using positions of mutually corresponding feature points of the time $t_{p_1}$ in which the first transmitted terahertz wave 341 is received and the time $t_{rej}$ in which the fourth transmitted terahertz wave 347 is received.

The second transmission time $t_{tr_2}$ may be a difference between a time $t_{p_2}$ in which the second transmitted terahertz wave 343 is received and a time $t_{rej}$ in which the fourth transmitted terahertz wave 347 is received, and additional content is equal to the content described with respect to the first transmission time $t_{tr_1}$.

The third transmission time $t_{tr_3}$ may be a difference between a time $t_{p_3}$ in which the third transmitted terahertz wave 345 is received and the time $t_{rej}$ in which the fourth transmitted terahertz wave 347 is received, and additional content is equal to the content described with respect to the first transmission time $t_{tr_1}$.

The thickness d of each layer of the multilayered specimen 500 may be calculated using at least one of Equation 1, Equation 2, and Equation 3.

The control unit 300 may measure the refractive index and the thickness of each layer of the specimen 500 so that a refractive index measuring area of each layer of the specimen 500 coincides with a thickness measuring area of each layer of the specimen 500. That is, when the fourth area 521, the fifth area 523, and the sixth area 525 coincide with the first area 511, the second area 513, and the third area 515, respectively, the control unit 300 calculates the thickness d of each layer of the specimen 500 according to the following equation.

According to Equation 3, an equation for the refractive index is $$n_{layer/k} = \frac{1}{1 - 2 \cdot \frac{(t_{tr_k} - t_{tr_{k-1}})}{(t_{re_k} - t_{re_{k-1}})}},$$

and an equation for the thickness d of each layer of the specimen 500 is as follows.

$$d_{layer/k} = \qquad\qquad\qquad\qquad\qquad\qquad\text{[Equation 4]}$$
$$\frac{C \cdot (t_{re_k} - t_{re_{k-1}})}{2 \cdot n_{layer/k}} = \frac{C \cdot [(t_{re_k} - t_{re_{k-1}}) - 2(t_{tr_k} - t_{tr_{k-1}})]}{2}$$

C: speed of light, $d_{layer/k}$: thickness of k layer, $t_{re_k}$: reflection time of k layer, $t_{re_{k-1}}$: reflection time of k−1 layer, $t_{tr_k}$: transmission time of k layer, and $t_{tr_{k-1}}$ transmission time of k−1 layer.

A description on parameters with respect to Equation 4 is equal to the content described with respect to Equations 1 to 3.

Accordingly, the control unit 300 may measure a thickness of at least one layer of the multilayered specimen 500 on the basis of at least one of the first reflection time, the second reflection time, the third reflection time, the first transmission time, the second transmission time, the third transmission time, and the speed of light.

The control unit 300 may measure a refractive index and a thickness of the specimen 500 so that at least one of refractive index measuring areas of respective layers of the specimen 500 differs from thickness measuring areas of respective layers of the specimen 500. The control unit 300 may measure the refractive index and the thickness of the specimen 500 so that refractive index measuring areas of respective layers of the specimen 500 differ from thickness measuring areas of respective layers of the specimen 500, respectively. That is, when the fourth area 521, the fifth area 523, and the sixth area 525 differ from the first area 511, the second area 513, and the third area 515, respectively, the control unit 300 calculates the thickness d of each layer of the specimen 500 according to the following equation.

According to Equations 1 and 3, an equation for the refractive index is $$n'_{layer/k} = \frac{1}{1 - 2 \cdot \frac{(t'_{tr_k} - t'_{tr_{k-1}})}{(t'_{re_k} - t'_{re_{k-1}})}},$$

and an equation for the thickness d of each layer of the specimen 500 is as follows.

$$d_{layer/k} = \frac{C \cdot (t_{re_k} - t_{re_{k-1}})}{2 \cdot n'_{layer/k}} = \quad \text{[Equation 5]}$$

$$C \cdot \left\{ (t_{re_k} - t_{re_{k-1}}) \cdot \left[ 1 - 2 \cdot \frac{(t'_{tr_k} - t'_{tr_{k-1}})}{(t'_{re_k} - t'_{re_{k-1}})} \right] \right\} / 2$$

(C: speed of light, $d_{layer/k}$: thickness of k layer, $n'_{layer/k}$: refractive index of k layer with respect to area different from thickness measuring area, $t_{re_k}$: reflection time of k layer, $t_{re_{k-1}}$ reflection time of k−1 layer, $t'_{re_k}$: reflection time of k layer with respect to area different from thickness measuring area, $t'_{re_{k-1}}$: reflection time of k−1 layer with respect to area different from thickness measuring area, $t'_{tr_k}$: transmission time of k layer with respect to area different from thickness measuring area, and $t'_{tr_{k-1}}$: transmission time of k−1 layer with respect to area different from thickness measuring area).

$n'_{layer/k}$ is a refractive index obtained by emitting a terahertz wave toward the fourth area 521, the fifth area 523, and the sixth area 525, and $d_{layer/k}$ is a thickness obtained by emitting a terahertz wave toward the first area 511, the second area 513, and the third area 515. Also, a description on Equation 5 in addition to parameters thereof is equal to the content described with respect to Equations 1 to 4.

Also, according to Equations 2 and 3, an equation for the refractive index is $$n'_{layer/k} = \frac{1}{1 - 2 \cdot \frac{(t'_{tr_k} - t'_{tr_{k-1}})}{(t'_{re_k} - t'_{re_{k-1}})}},$$

and an equation for the thickness d of each layer of the specimen 500 is as follows.

$$d_{layer/k} = \frac{C \cdot (t_{tr_k} - t_{tr_{k-1}})}{n'_{layer/k} - 1} = \quad \text{[Equation 6]}$$

$$C \cdot \left\{ (t_{tr_k} - t_{tr_{k-1}}) \cdot \left[ \frac{(t'_{re_k} - t'_{re_{k-1}})}{(t'_{tr_k} - t'_{tr_{k-1}})} - 2 \right] \right\} / 2$$

(C: speed of light, $d_{layer/k}$: thickness of k layer, $n'_{layer/k}$: refractive index of k layer with respect to area different from thickness measuring area, $t_{re_k}$: reflection time of k layer, $t_{re_{k-1}}$: reflection time of k−1 layer, $t'_{re_k}$: reflection time of k layer with respect to area different from thickness measuring area, $t'_{re_{k-1}}$: reflection time of k−1 layer with respect to area different from thickness measuring area, $t'_{tr_k}$: transmission time of k layer with respect to area different from thickness measuring area, and $t'_{tr_{k-1}}$: transmission time of k−1 layer with respect to area different from thickness measuring area).

$n'_{layer/k}$ is a refractive index obtained by emitting a terahertz wave toward the fourth area 521, the fifth area 523, and the sixth area 525, and $d_{layer/k}$ is a thickness obtained by emitting a terahertz wave toward the first area 511, the second area 513, and the third area 515. Also, a description on Equation 6 in addition to parameters thereof is equal to the content described with respect to Equations 1 to 5.

Accordingly, even when the refractive index of each of the specimens is not known, the thickness of each of the multilayered specimens may be measured according to the specimen thickness measuring method according to the embodiment. According to the specimen thickness measuring method according to the embodiment, refractive indexes and thicknesses of respective layers may be integrally measured. Also, according to the specimen thickness measuring method, a nondestructive inspection may be performed using a terahertz wave with high transmittance. Also, pieces of information applied to Equations 1 to 6 for thickness calculation may be obtained repeatedly. When pieces of information applied to Equations 1 to 6 for thickness calculation are obtained repeatedly, the pieces of information may be applied to Equations 1 to 6 using an average of repeatedly obtained values so that the thickness of each layer of the specimen may be more precisely measured.

A specimen thickness measuring program according to one embodiment of the present application may be a specimen thickness measuring program stored in a medium to determine whether the plurality of specimens are defective according to the thickness measuring method.

The invention claimed is:

1. A specimen thickness measuring method, the method comprising:
   emitting, a first terahertz wave toward a first area of an upper portion of a first layer of a specimen including the first layer and a second layer, wherein a lower portion of the second layer of the specimen contacts at least part of the upper portion of the first layer, and the upper portion of the first layer includes the first area formed by removing at least part of the second layer;
   receiving a first reflected terahertz wave reflected by the specimen;
   emitting a second terahertz wave toward a second area of an upper portion of the second layer;
   receiving a second reflected terahertz wave reflected by the specimen;
   storing refractive indexes of the first layer and the second layer; and
   calculating thicknesses of the first layer and the second layer based on at least one of a first reflection time of the first reflected terahertz wave which is reflected and received, a second reflection time of the second reflected terahertz wave which is reflected and received, and a refractive index of each layer,
   wherein the first area and the second area are different areas.

2. The method of claim 1,
wherein the thicknesses of the first layer and the second layer are calculated based on the first reflection time and the second reflection time,
wherein the first reflection time is a difference between a time when a first surface-reflected terahertz wave is received and a time when a first backside-reflected terahertz wave is received,
wherein the first reflection time is a difference between a time when a second surface-reflected terahertz wave is received and a time when a second backside-reflected terahertz wave is received,
wherein the first reflected terahertz wave includes the first surface-reflected terahertz wave and the first backside-reflected terahertz wave,
wherein the second reflected terahertz wave includes the second surface-reflected terahertz wave and the second backside-reflected terahertz wave,
wherein the first surface-reflected terahertz wave is that the first terahertz wave is reflected from a surface of the first area, and the first backside-reflected terahertz wave is that the first terahertz wave is reflected from a backside of the specimen,
wherein the second surface-reflected terahertz wave is that the second terahertz wave is reflected from a surface of the second area, and the second backside-reflected terahertz wave is that the second terahertz wave is reflected from the backside of the specimen.

3. The method of claim 2,
wherein the calculating thicknesses of the first layer and the second layer based on the first reflection time, the second reflection time, a refractive index of the first layer and a refractive index of the second layer employs an equation, $$d_{layer/k} = \frac{C \cdot (t_{re_k} - t_{re_{k-1}})}{2 \cdot n_{layer/k}}.$$

(C: speed of light, $d_{layer,k}$: thickness of k layer, $n_{layer/k}$: refractive index of k layer, $t_{re_k}$: reflection time of k layer, $t_{re_{k-1}}$: reflection time of k−1 layer).

4. The method of claim 3,
wherein the refractive indexes of the first layer and the second layer are respectively pre-stored refractive indexes,
wherein when measuring the thicknesses of the first layer and the second layer, values of the pre-stored refractive indexes are respectively employed.

5. The method of claim 2,
wherein the thicknesses of the first layer and the second layer are available for being measured multiple times for at least one of the first area and the second area,
wherein average values of each of values of the thicknesses of the first layer and the second layer obtained by measuring multiple times are the thicknesses of the first layer and the second layer.

6. The method of claim 3,
wherein the refractive indexes of the first layer and the second layer are calculated based on at least one of a third reflected terahertz wave, a fourth reflected terahertz wave, a first transmitted terahertz wave, and a second transmitted terahertz wave,
wherein the third reflected terahertz wave is formed by reflecting the first terahertz wave to a third area,
wherein the fourth reflected terahertz wave is formed by reflecting the second terahertz wave to a fourth area,
wherein the first transmitted terahertz wave is formed by transmitting the first terahertz wave through the third area,
wherein the second transmitted terahertz wave is formed by transmitting the second terahertz wave through the fourth area,
wherein the third area is located at the upper portion of the first layer, the fourth area is located at the upper portion of the second layer, and the first layer includes the third area formed by removing at least a part of the second layer,
wherein the third area and the fourth area are different areas.

7. The method of claim 6,
wherein the refractive index of the first layer and the refractive index of the second layer are calculated based on a third reflection time, a fourth reflection time, a first transmission time and a second transmission time,
wherein the third reflection time is a difference between a time when a third surface-reflected terahertz wave is received and a time when a third backside-reflected terahertz wave is received,
wherein the fourth reflection time is a difference between a time when a fourth surface-reflected terahertz wave is received and a time when a fourth backside-reflected terahertz wave is received,
wherein the first transmission time is a difference between a time when the first transmitted terahertz wave is received and a time when the third transmitted terahertz wave is received,
wherein the second transmission time is difference between a time when the second transmitted terahertz wave is received and a time when the third transmitted terahertz wave is received,
wherein the third reflected terahertz wave includes the third surface-reflected terahertz wave and the third backside-reflected terahertz wave,
wherein the fourth reflected terahertz wave includes the fourth surface-reflected terahertz wave and the fourth backside-reflected terahertz wave,
wherein the third surface-reflected terahertz wave is that the third terahertz wave is reflected from a surface of the third area, and the third backside-reflected terahertz wave is that the third terahertz wave is reflected from the backside of the specimen,
wherein the fourth surface-reflected terahertz wave is that the fourth terahertz wave is reflected from the surface of the second area, and the fourth backside-reflected terahertz wave is that the second terahertz wave is reflected from the backside of the specimen.

8. The method of claim 7,
wherein the calculating the refractive indexes of the first layer and the second layer based on the third reflection time, the fourth reflection time, the first transmission time, and the second transmission time respectively employs an equation, $$n_{layer/k} = \frac{1}{1 - 2\frac{(t_{tr_k} - t_{tr_{k-1}})}{(t_{re_k} - t_{re_{k-1}})}}.$$

($n_{layer}$: refractive index of k layer, $t_{re_k}$: reflection time of k layer, $t_{re_{k-1}}$: reflection time of k−1 layer, $t_{tr_k}$: transmission time of k layer, $t_{tr_{k-1}}$: transmission time of k−1 layer).

9. The method of claim 6,
wherein the refractive index of the first layer and the refractive index of the second layer are available for being measured multiple times for at least one of the third area and the fourth area,
wherein average values of each of values of the refractive indexes of the first layer and the second layer obtained by measuring are the refractive indexes of the first layer and the second layer.

10. The method of claim 6,
wherein the first area and the third area are same, the second area and the fourth area are same,
wherein the refractive indexes of the first layer and the second layer and the thicknesses of the first layer and the second layer are respectively measured at same area.

11. The method of claim 8,
wherein the first area and the third area are same, the second area and the fourth area are same, and the calculating thicknesses of the first layer and the second layer employs an equation, $$d_{layer/k} = \frac{C \cdot [(t_{re_k} - t_{re_{k-1}}) - 2(t_{tr_k} - t_{tr_{k-1}})]}{2}.$$

(C: speed of light, $d_{layer/k}$: thickness of k layer, $t_{re_k}$: reflection time of k layer, $t_{re_{k-1}}$: reflection time of k−1 layer, $t_{tr_k}$: transmission time of k layer, $t_{tr_{k-1}}$: transmission time of k−1 layer).

12. The method of claim 8,
wherein the first area and the third area are different, the second area and the fourth area are different,
wherein an equation for calculating the refractive index is $$n'_{layer/k} = \frac{1}{1 - 2\frac{(t'_{tr_k} - t'_{tr_{k-1}})}{(t'_{re_k} - t'_{re_{k-1}})}},$$

wherein the calculating the thicknesses of the first layer and the second layer employs an equation, $$d_{layer/k} = \frac{C \cdot (t_{re_k} - t_{re_{k-1}})}{2 \cdot n'_{layer/k}} = C \cdot \left\{ (t_{re_k} - t_{re_{k-1}}) \cdot \left[ 1 - 2 \cdot \frac{(t'_{tr_k} - t'_{tr_{k-1}})}{(t'_{re_k} - t'_{re_{k-1}})} \right] \right\} / 2.$$

(C: speed of light, $d_{layer/k}$: thickness of k layer, $n'_{layer/k}$: refractive index of k layer, $t_{re_k}$: reflection time of k layer, $t_{re_{k-1}}$: reflection time of k−1 layer, $t'_{re_k}$: reflection time of k layer in an area different from thickness measurement area, $t'_{re_{k-1}}$: reflection time of the k−1 layer in an area different from thickness measurement area, $t'_{tr_k}$: transmission time of the k layer in an area different from thickness measurement area, $t'_{tr_{k-1}}$ transmission time of the k−1 layer in an area different from thickness measurement area).

13. The method of claim 11,
wherein the thicknesses and the refractive indexes of the first layer and the second layer are available for being measured multiple times for at least one of the first area and the second area, the third area, and the fourth area,
wherein average values of values of the thicknesses or the refractive indexes of the first layer and the second layer obtained by measuring multiple times are the thicknesses of the first layer and the second layer.

14. The method of claim 12,
wherein the thicknesses and the refractive indexes of the first layer and the second layer are available for being measured multiple times for at least one of the first area and the second area, the third area, and the fourth area,
wherein average values of values of the thicknesses or the refractive indexes of the first layer and the second layer obtained by measuring multiple times are the thicknesses of the first layer and the second layer.

15. A specimen thickness measuring device, the device comprising:
an emission unit configured to emit a terahertz wave including a first terahertz wave and a second terahertz wave toward a specimen including a first layer and a second layer;
a reception unit configured to receive a reflected terahertz wave including a first reflected terahertz wave and a second reflected terahertz wave reflected by the specimen; and
a control unit configured to control the emission unit and the reception unit,
wherein the control unit is configured to:
control the emission unit to emit a first terahertz wave toward the first area of an upper portion of the first layer in the specimen, wherein a lower portion of the second layer of the specimen contacts at least a part of the upper portion of the first layer and the upper portion of the first layer includes the first area formed by removing at least a part of the second layer,
control the reception unit to receive the first reflected terahertz wave reflected by the specimen,
control the emission unit to emit the second terahertz wave to the second area of an upper portion of the second layer,
control to receive the second reflected terahertz wave reflected by the specimen,
control to store refractive indexes of the first layer and the second layer, and
control to calculate thicknesses of the first layer and the second layer based on at least one of a first reflection time when the first reflected terahertz wave is reflected and received, a second reflection time when the second reflected terahertz wave is reflected and received, and a refractive index of each layer, and
wherein the first area and the second area are different areas.

16. A storage medium storing a specimen thickness measuring program for measuring thicknesses of a first layer and a second layer, in according to a specimen thickness measuring method comprising:
emitting, in a specimen including the first layer and the second layer, a first terahertz wave toward a first area of an upper portion of the first layer, wherein a lower portion of the second layer of the specimen contacts at least part of the upper portion of the first layer, and the upper portion of the first layer includes the first area formed by removing at least part of the second layer;

receiving a first reflected terahertz wave reflected by the specimen;

emitting a second terahertz wave toward a second area of an upper portion of the second layer;

receiving a second reflected terahertz wave reflected by the specimen;

storing refractive indexes of the first layer and the second layer; and calculating thicknesses of the first layer and the second layer based on at least one of a first reflection time when the first reflected terahertz wave is reflected and received, a second reflection time when the second reflected terahertz wave is reflected and received, and a refractive index of each layer, wherein the first area and the second area are different areas.

* * * * *